(12) United States Patent
Ono et al.

(10) Patent No.: US 12,287,569 B2
(45) Date of Patent: Apr. 29, 2025

(54) PELLICLE FILM FOR PHOTOLITHOGRAPHY, PELLICLE, PHOTOLITHOGRAPHY MASK, PHOTOLITHOGRAPHY SYSTEM, AND METHOD OF PRODUCING PELLICLE FILM FOR PHOTOLITHOGRAPHY

(71) Applicants: MITSUI CHEMICALS, INC., Tokyo (JP); NATIONAL INSTITUTE OF ADVANCED INDUSTRIAL SCIENCE AND TECHNOLOGY, Tokyo (JP)

(72) Inventors: Yousuke Ono, Sodegaura (JP); Hisako Ishikawa, Ichihara (JP); Ryohei Ogawa, Ichihara (JP); Atsushi Okubo, Tokyo (JP); Kazuo Kohmura, Iwakuni (JP); Atsuko Sekiguchi, Tsukuba (JP); Yuichi Kato, Tsukuba (JP); Takeo Yamada, Tsukuba (JP); Ying Zhou, Tsukuba (JP)

(73) Assignees: MITSUI CHEMICALS, INC., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 17/996,098

(22) PCT Filed: Apr. 2, 2021

(86) PCT No.: PCT/JP2021/014353
§ 371 (c)(1),
(2) Date: Oct. 13, 2022

(87) PCT Pub. No.: WO2021/210432
PCT Pub. Date: Oct. 21, 2021

(65) Prior Publication Data
US 2023/0194977 A1    Jun. 22, 2023

(30) Foreign Application Priority Data

Apr. 17, 2020   (JP) ................................ 2020-074343

(51) Int. Cl.
*G03F 1/62*    (2012.01)

(52) U.S. Cl.
CPC .................................... *G03F 1/62* (2013.01)

(58) Field of Classification Search
CPC ....... G03F 1/62; G03F 7/70983; C01B 32/16; C01B 32/168; C01B 32/17
See application file for complete search history.

(56) References Cited

U.S. PATENT DOCUMENTS

| | | |
|---|---|---|
| 2008/0152873 A1 | 6/2008 | Okoroanyanwu et al. |
| 2017/0038676 A1 | 2/2017 | Jung et al. |
| | (Continued) | |

FOREIGN PATENT DOCUMENTS

| | | | |
|---|---|---|---|
| CN | 101417257 A | * | 4/2009 |
| JP | 2018-194838 A | | 12/2018 |
| | (Continued) | | |

*Primary Examiner* — Mark F. Huff
*Assistant Examiner* — Moriah S. Smoot
(74) *Attorney, Agent, or Firm* — BUCHANAN INGERSOLL & ROONEY PC

(57) ABSTRACT

A pellicle film for photolithography including a carbon nanotube film, in which the carbon nanotube film contains carbon nanotubes; the carbon nanotube film transmits 80% or more of EUV light at a wavelength of 13.5 nm; the carbon nanotube film has a thickness from 1 nm to 50 nm; the carbon nanotube film is deposited on a silicon substrate, in which the 3σ of the reflectance is 15% or less when the reflectance of the deposited carbon nanotube film is measured using a reflectance spectrophotometer-based film thickness meter under the following conditions: the diameter of measurement spots, 20 μm; the reference measurement wavelength, 285 nm; the number of measurement spots, 121

(Continued)

IN THE CASE OF AN OPTICAL SYSTEM WITH A NA OF 0.33 spots; the distance between the centers of adjacent measurement spots, 40 μm.

14 Claims, 19 Drawing Sheets

(56) References Cited

U.S. PATENT DOCUMENTS

| | | | |
|---|---|---|---|
| 2018/0329289 A1* | 11/2018 | Gallagher | ................ G03F 1/62 |
| 2018/0329291 A1 | 11/2018 | Timmermans et al. | |
| 2019/0091950 A1* | 3/2019 | Hernandez Rueda | ...................... B29C 59/026 |
| 2019/0129300 A1 | 5/2019 | Ono et al. | |

FOREIGN PATENT DOCUMENTS

| | | | | |
|---|---|---|---|---|
| JP | 2018-194840 A | | 12/2018 | |
| JP | 2019-168502 A | | 10/2019 | |
| KR | 20100082707 A | * | 7/2010 | |
| KR | 101082093 B1 | * | 11/2011 | |
| WO | 2016/001351 A1 | | 1/2016 | |
| WO | WO-2018008594 A1 | * | 1/2018 | ........... C01B 32/159 |
| WO | 2019188977 A1 | | 10/2019 | |

\* cited by examiner

PELLICLE FILM FOR PHOTOLITHOGRAPHY, PELLICLE, PHOTOLITHOGRAPHY MASK, PHOTOLITHOGRAPHY SYSTEM, AND METHOD OF PRODUCING PELLICLE FILM FOR PHOTOLITHOGRAPHY

TECHNICAL FIELD

The present disclosure relates to a pellicle film for photolithography, a pellicle, a photolithography mask, a photolithography system, and a method of producing a pellicle film for photolithography.

BACKGROUND ART

A pellicle film used in a pellicle is usually produced by depositing silicon nitride (SiN) or the like on a silicon substrate.

However, since carbon nanotube is a material that has high transmittance of light (for example, EUV light) and shows excellent durability, a pellicle in which a carbon nanotube film is used is now under development.

For example, Patent Document 1 discloses a pellicle film for photolithography, which is to be laid across an opening in a supporting frame, has a thickness of 200 nm or less, and includes a carbon nanotube film, in which the carbon nanotube film is composed of bundles of carbon nanotubes, and each bundle has a diameter of 100 nm or less, and the bundles extend along the in-plane direction.

Patent Document 1: WO2018/008594

SUMMARY OF INVENTION

Problem to be Solved by the Invention

Conventional carbon nanotube (CNT) films could have a less uniform thickness due to the presence of higher-order aggregate structures of CNT bundles resulting from, for example, less spreading of the CNT bundles.

The less uniform thickness of a CNT film leads to uneven in-plane distribution of transmitted light and to in-plane variation in exposure dose across a photoresist, which in turn causes poor exposure, reduced patterning performance, and the like, when a pellicle that includes a pellicle film consisting of the CNT film is used in the lithography process.

The uneven thickness of the CNT film may be a cause of reduction in transparency and of decrease in the in-plane uniformity of conductivity and other properties.

Additionally, the uneven surface of the CNT film may cause a microscopic concentration of stress to occur, which in turn causes reduction in the mechanical strength of the CNT film.

The resolution of a photolithography system is dependent on the wavelength of illumination light and on the numerical aperture of a projection optical system. Thus, it is understood that an illumination light of a shorter wavelength and a projection optical system with a higher numerical aperture are effective to increase the resolution of a photolithography system (see Proc. of SPIE, Vol. 9422, 94221G-7).

For example, the numerical aperture (NA) may be in the range from 0.0825 to 0.138 when EUV light is used in the EUV lithography process to form an image on the surface of a photomask.

Because a pellicle for use in EUV lithography is placed about 2 mm above the photomask surface, a photobeam that forms an image on the photomask surface will be expanded to a diameter of 330 μm to 550 μm when the numerical aperture is in the above-described range (see FIG. 1).

EUV lithography may use a modified illumination method to the shape of the entrance pupil, through which light enters, to be changed to different shapes (for example, dipole, quadrupole, and the like) (see FIG. 2 and Proc. of SPIE, Vol. 8886, 888604-1).

Thus, a part of the incident EUV light that illuminates an area with a diameter as described above is the EUV light that forms an image on the photomask surface in EUV lithography.

In other words, in the pellicle film, the ratio between an area of the part through which the EUV light reaching to the photomask surface and used for image formation passes and the area of the part corresponding to the diameter as described above, though the ratio varies depending on the shape of illumination distribution, in a case in which the ratio is 1/10 to 1/20, the diameter is equivalent to about 50 μm to 100 μm.

Specific examples of modified illumination shapes in the modified illumination method are shown in FIG. 3.

A pellicle film for use in EUV lithography is generally required to have 0.4% or less transmittance uniformity. For the above transmittance uniformity, the area with a diameter as described above is considered as unit size and unit area. That is, at least the entirety of an exposed area of 132 mm×104 mm, more preferably the entire area of the pellicle film (144 mm×110 mm), is required to have a uniform transmittance for every unit area, which corresponds to an area with a diameter of about 50 μm to 100 μm.

In a pellicle film, the presence of lumps, aggregates, or others of around 50 μm in size may result in a reduced transmittance at the sites of the above lumps or aggregates, which in turn causes poor exposure.

Accordingly, there is a need to form a CNT film with a uniform thickness for every unit area with a diameter of 50 μm to 100 μm, such that a transmittance uniformity of 0.4% or less is maintained over the entire surface of a pellicle film.

In Patent Document 1, the thickness uniformity in a CNT film is not studied well, and there remains room for improvement.

In addition, the inventors found that a reflectance measurement method was effectively used as a method for evaluation of transmittance uniformity.

A problem solved by one embodiment of the disclosure is to provide a pellicle film for photolithography with high uniformity in thickness, a pellicle including the above pellicle film for photolithography, a photolithography mask and a photolithography system, and a method of producing a pellicle film for photolithography.

Means for Solving the Problem

Specific measures for solving the above problems include the following aspects.

<1> A pellicle film for photolithography, including a carbon nanotube film, in which the carbon nanotube film contains carbon nanotubes; the carbon nanotube film transmits 80% or more of EUV light at a wavelength of 13.5 nm; the carbon nanotube film has a thickness from 1 nm to 50 nm; the carbon nanotube film is disposed on a silicon substrate, in which a 3σ of a reflectance is 15% or less in a case in which a reflectance of the disposed carbon nanotube film is measured using a reflectance spectrophotometer-based film thickness meter under the following conditions:

a diameter of measurement spots of 20 μm;

a reference measurement wavelength of 285 nm;

a number of measurement spots of 121 spots; and a distance between centers of adjacent measurement spots of 40 μm.

<2> The pellicle film for photolithography according to <1>, in which the carbon nanotube film is disposed on a silicon substrate, in which a value obtained by subtracting a minimum average reflectance from a maximum average reflectance is calculated to be 15% or less in a case in which the reflectance of the disposed carbon nanotube film is measured at multiple measurement positions spaced 2 cm or more apart from each other by using a reflectance spectrophotometer-based film thickness meter under the following conditions to calculate the average reflectance:

the diameter of measurement spots of 20 μm;
the reference measurement wavelength of 285 nm;
the number of measurement spots of 121 spots; and
the distance between the centers of adjacent measurement spots of 40 μm.

<3> The pellicle film for photolithography according to <1> or <2>, in which the carbon nanotubes have a tube diameter from 0.8 nm to 6.0 nm.

<3-1> The pellicle film for photolithography according to any one of <1> to <3>, in which the carbon nanotube film has a mesh structure.

<4> The pellicle film for photolithography according to any one of <1> to <3>, further including a protective layer disposed in contact with the carbon nanotube film.

<5> The pellicle film for photolithography according to any one of <1> to <4>, in which the carbon nanotubes have an effective length of 0.1 μm or more.

<6> The pellicle film for photolithography according to any one of <1> to <5>, in which a breaking load determined by a nanoindentation test is 1.0 μN/nm or more.

<7> A pellicle, including a pellicle film for photolithography according to any one of <1> to <6> and a supporting frame for supporting the pellicle film for photolithography.

<8> A photolithography mask, including a photomask and the pellicle according to <7> disposed on a patterned surface of the photomask.

<9> A photolithography system, including the photolithography mask according to <8>.

<10> A photolithography system, including a light source that emits illumination light, the photolithography mask according to <8>, and an optical system that guides the illumination light emitted from the light source to the photolithography mask, in which the photolithography mask is disposed such that the illumination light emitted from the light source passes through the pellicle film for photolithography and illuminates the photolithography mask.

<11> The photolithography system according to <10>, in which the illumination light is EUV light.

<12> A method of producing the pellicle film for photolithography according to any one of <1> to <6>, the method including the steps of: preparing raw carbon nanotubes including aggregates; mixing the raw carbon nanotubes with a solvent to produce a dispersion; removing the aggregates contained in the dispersion to obtain refined carbon nanotubes; and forming a sheet from the refined carbon nanotubes to produce a carbon nanotube film.

<13> The method of producing a pellicle film for photolithography according to <12>, in which ultracentrifugation is performed at an average relative centrifugal force of 3,000×g or more in the step of obtaining refined carbon nanotubes.

Effects of the Invention

One embodiment of the disclosure can provide a pellicle film for photolithography with high uniformity in thickness, a pellicle including the above pellicle film for photolithography, a photolithography mask and a photolithography system, and a method of producing a pellicle film for photolithography.

DESCRIPTION OF EMBODIMENTS

Figure 1:
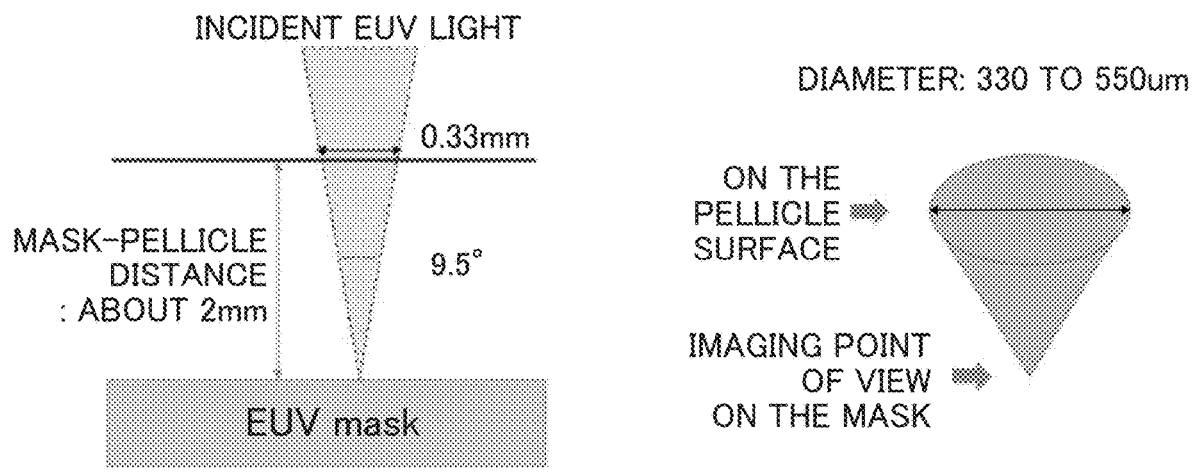
FIG. 1 shows a schematic diagram for explaining the diameter of an EUV beam on a pellicle film, where the EUV light passes through the pellicle film.
Figure 2:
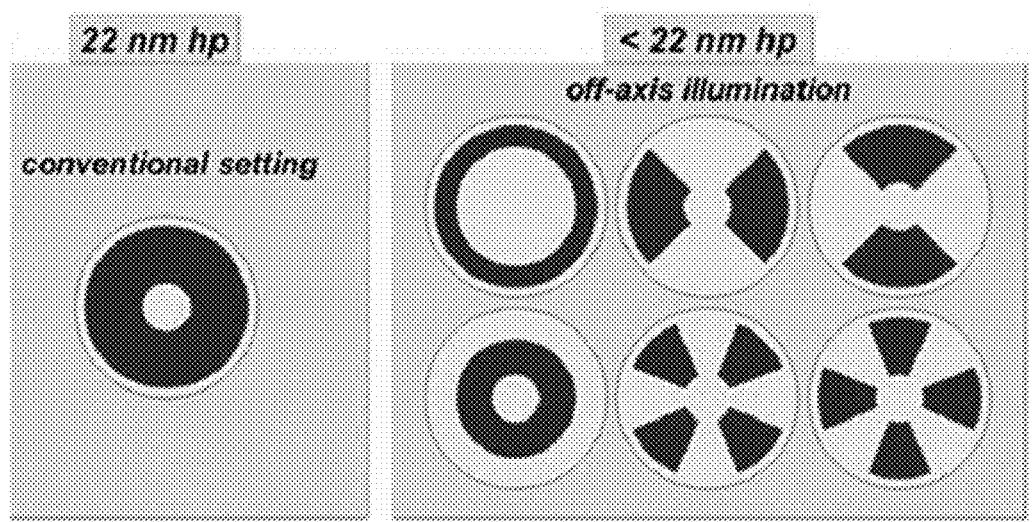
FIG. 2 shows specific examples of entrance pupil shapes in the modified illumination method.
Figure 3:
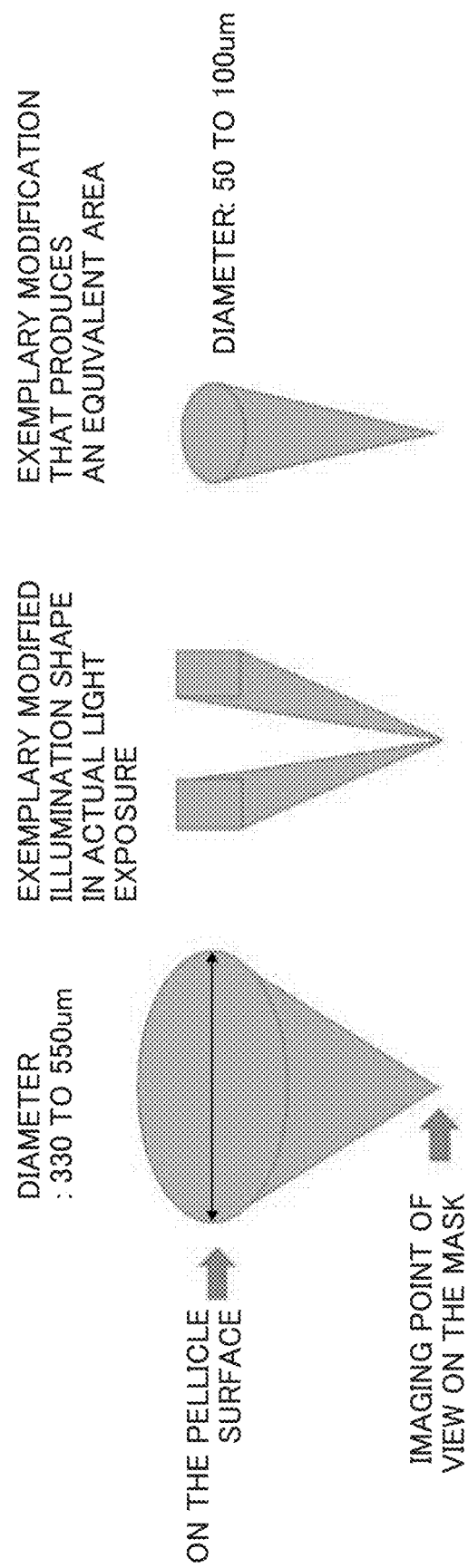
FIG. 3 shows specific examples of modified illumination shapes in the modified illumination method.

When a numerical range is given using the word "to" in this disclosure, the numerical range is meant to include the numbers placed before and after "to" as the lower and upper limit values, respectively.

For a series of numerical ranges described hierarchically in this disclosure, the upper or lower limit value in one of the numerical ranges may be replaced with that of any other numerical range. In addition, for numerical ranges described in this disclosure, the upper or lower value in one of the numerical ranges may be replaced with that indicated in Examples.

In this disclosure, any combination of two or more preferred aspects will be considered as a more preferable aspect.

In this disclosure, the amount of each component has the same meaning as the total amount of multiple substances when those substances correspond to the component, unless otherwise specifically stated.

In the disclosure, the term "step" is not limited only to an independent step, but also includes a step that is not clearly distinguished from any other step if the purpose expected in conjunction with the step is achieved.

A pellicle film for photolithography, a carbon nanotube film, and a carbon nanotube assembly according to embodiments of the disclosure will be described in detail below with reference to the drawings.

The following embodiments are exemplary embodiments of the disclosure, and the present disclosure is not to be construed as limited to those embodiments.

<<Pellicle Film for Photolithography>>

A pellicle film of the disclosure for photolithography includes a carbon nanotube film, in which the carbon nanotube film contains carbon nanotubes; the carbon nanotube film transmits 80% or more of EUV light at a wavelength of 13.5 nm; the carbon nanotube film has a thickness from 1 nm to 50 nm; the carbon nanotube film is deposited on a silicon substrate, in which the 3σ of the reflectance is 15% or less when the reflectance of the deposited carbon nanotube film is measured using a reflectance spectrophotometer-based film thickness meter under the following conditions:
 the diameter of measurement spots, 20 μm;
 the reference measurement wavelength, 285 nm;
 the number of measurement spots, 121 spots;
 the distance between the centers of adjacent measurement spots, 40 μm.

In the case of a pellicle film including a CNT film, the CNT film could have a less uniform thickness due to the presence of higher-order aggregate structures of CNT bundles resulting from, for example, less spreading of the CNT bundles.

The above aggregate structures of CNT bundles can be observed as areas of darker color (also referred to as "aggregates") than other areas or as areas of so-called lumps (also referred to simply as "lumps") under a light microscope.

The above-described organization can allow the pellicle film of the disclosure for photolithography to reduce formation of the aggregate structures of CNT bundles and to have high thickness uniformity.

<CNT Film>

A CNT film disclosed herein contains CNTs and transmits 80% or more of EUV light at a wavelength of 13.5 nm.
(Organization of CNT Film)

Figure 4:
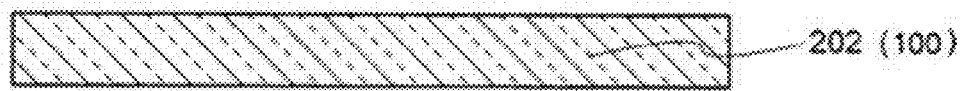
FIG. 4 shows a cross-sectional diagram of a CNT film according to one embodiment of the disclosure.
Figure 5:
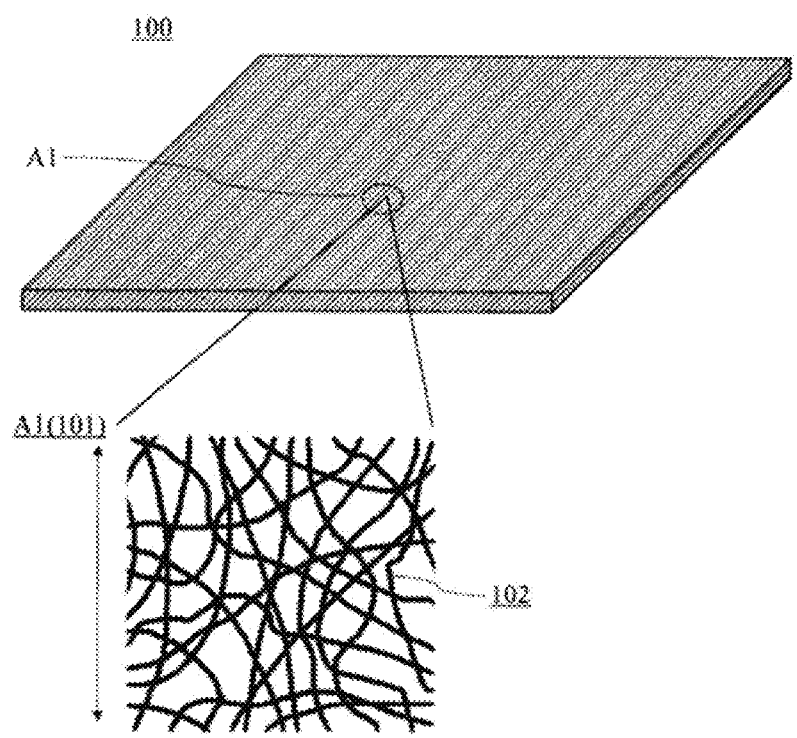
FIG. 5 shows schematic illustrations of a CNT film and a CNT assembly according to one embodiment of the disclosure.

A CNT film 100 will be described below. FIG. 4 shows a cross-sectional diagram of a pellicle film 202 that contains the CNT film 100. FIG. 5 shows schematic illustrations of the CNT film 100 and a CNT assembly 101 that is formed by assembly of CNTs 102. FIG. 5 also shows an enlarged view of an area A1 in the CNT film.

In FIG. 4, the CNT film 100 is composed of the CNT assembly 101.

As shown in FIG. 5, the CNT assembly 101 contains many CNTs (or CNT bundles) 102.

<Reflectance>

When the CNT film disclosed herein is deposited on a silicon substrate to measure the reflectance of the deposited CNT film by using a reflectance spectrophotometer-based film thickness meter under the following conditions, the 3σ of the reflectance in the CNT film is 15% or less:

<Conditions>
 the diameter of measurement spots, 20 μm;
 the reference measurement wavelength, 285 nm;
 the number of measurement spots, 121 spots;
 the distance between the centers of adjacent measurement spots, 40 μm.

The Greek letter σ represents the standard deviation.

The above reflectance measurement method can be used to evaluate the transmittance uniformity of the film.

The wavelength for the measurement is preferred to be 285 nm because a small difference in film thickness can be detected with the wavelength of light.

The change in reflectance resulting from a change in film thickness becomes smaller, for example, when visible light with a wavelength from 400 nm to 800 nm is used than when light in the ultraviolet range is used, which suggests that ultraviolet light is more suitable for use than light in the visible light range.

Figure 6:
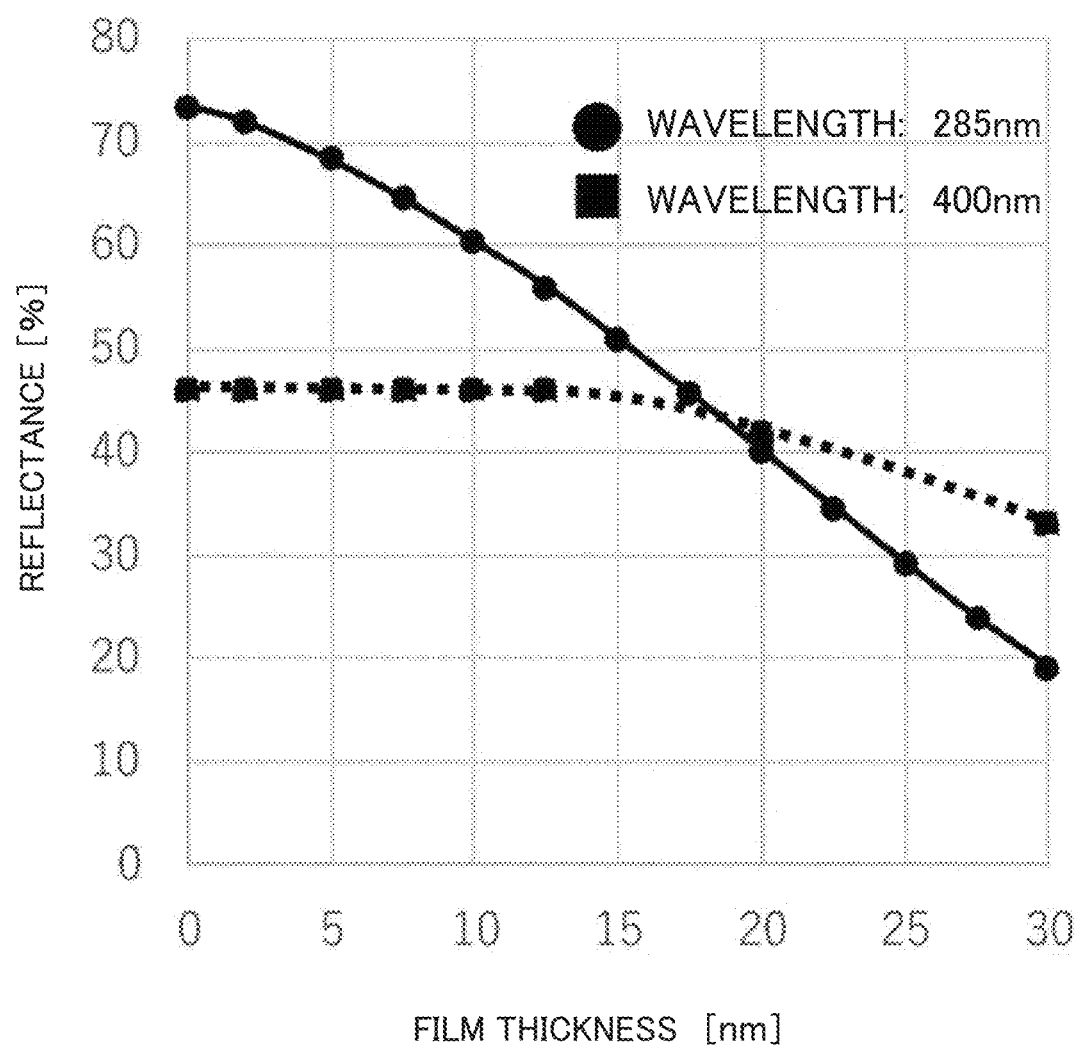
FIG. 6 shows a graph depicting the relationship between the reflectance at wavelengths of 285 nm and 400 nm and the film thickness.

As shown in FIG. 6, the reflectance at a wavelength of 400 nm is changed from 46% to 42%, which means a difference of only 4%, while the film thickness is changed from 1 nm to 20 nm. Meanwhile, in the case of using ultraviolet light at a wavelength of 285 nm, the reflectance is changed from 72% to 40%, which means a difference of even 32%, while the thickness is changed from 1 nm to 20 nm.

Assuming that the reflectance is measured with an accuracy of 0.5%, the measurement of film thickness by using the reflectance of ultraviolet light provides an accuracy of 0.3 nm, which allows for detection of a difference as small as 1 nm or less in film thickness.

The use of ultraviolet light together with a silicon substrate as the substrate to which the above CNT film is deposited can provide highly sensitive and accurate measurement of the variation in film thickness in the range from 1 nm to 50 nm.

Even in a case in which a substrate made from a material other than silicon is used as the substrate, the reflectance of the above CNT film in the form of free-standing film can be measured. However, the substrate is preferred to have (1) a high reflectance (high refractive index and high extinction coefficient) in the ultraviolet wavelength range and (2) a high surface smoothness (for example, surface roughness Ra=0.3 nm or less), which allows for receiving regular-reflection light from the surface of the substrate, to measure the reflectance with high accuracy and reproducibility for the detection of a small change in film thickness.

From those points of view, a metal substrate or a silicon substrate is preferred as the substrate.

A silicon substrate is more preferred for use as the substrate because silicon substrates are widely used and have less variation in quality.

The size of spots to measure the reflectance (that is, the diameter of measurement spots) is not specifically limited, but the size of the spots is preferred to be in the range from 10 µm to 1000 µm.

For CNT films with a mesh structure composed of tubes with a diameter of several nanometers or of bundles with a diameter of 100 nm or less, the in-plane density (thickness) of bundles or mesh nodes are easily variable, and the variation in thickness tends to be dependent on the diameter of spots for the thickness measurement. The 3σ value, which is indicative of the uniformity of thickness of a film, is inversely proportional to the measured area, and the 3σ value determined for the spots of a known size can be converted to a 3σ value for an area with a size of 50 µm to 100 µm.

However, because the variation (3σ) arising from the accuracy of a measuring device is desired to be small enough compared to the true value, the spot size is preferably from 10 µm to 1000 µm, more preferably from 20 µm to 500 µm.

In the reflectance measurement, the detection of reflected light is not limited to a specific method, and a photodiode, a photomultiplier, or the like can be used for the measurement.

Additionally, a multi-channel detector such as a photodiode array or a charge-coupled device (CCD) may be used.

The reflectance can be measured at multiple wavelengths by diffracting the reflected light and detecting the resulting light with a photodiode array. Moreover, the distribution of reflected light intensity may be analyzed by a CCD detector with an adjusted pixel size of about 50 µm to 100 µm.

Preferably, the reflectance is measured at 100 or more measurement spots to evaluate the thickness uniformity.

When the 3σ of the reflectance is 15% or less, the CNT film has high film uniformity over local areas including the above number of measurement spots.

From the same points of view as above, the 3σ of the reflectance is preferably 12.0% or less, more preferably 10.0% or less, still more preferably 8.0% or less.

The lower limit of the 3σ of the reflectance is not specifically limited; for example, the 3σ of the reflectance of the CNT film may be more than 0% or can be 0.10% or more.

[3σ of Reflectance and Average Reflectance]

A method for determination of "the 3σ and average values of reflectance by measurement using a reflectance spectrophotometer-based film thickness meter under conditions including the above measurement spots, the above wavelength for the standard measurement, and the above number of measurement spots" will be described.

First, a CNT film is deposited on a silicon substrate, and the diagonal line across the deposited CNT film is defined as the X axis.

For depositing a CNT film on a silicon substrate, the silicon substrate and the CNT film are brought into close contact with each other without any gap. A solvent such as water or an organic solvent can be placed between the silicon substrate and the CNT film and then dried to bring the silicon substrate and the CNT film into close contact with each other without any gap.

For example, to bring a silicon substrate and a CNT film into close contact with each other, the CNT film may be floated on water, collected onto the silicon substrate, and then dried, or the CNT film may be placed in a drop of a solvent on the silicon substrate and then dried.

In a case in which a pellicle film is attached to a supporting frame, the CNT film can be deposited on a silicon substrate by bringing a region in the pellicle film that corresponds to a region in the form of a free-standing film (that is, a region unattached to the supporting frame) into contact with the silicon substrate that has been prepared by wetting with a solvent or the like.

The silicon substrate is not limited to a particular size, but a silicon wafer of 8 inches or larger in size is suitable for use, considering the close contact with a large area of the pellicle film.

Next, arbitrary "measurement positions" on the CNT film are selected.

At each of the selected "measurement positions," 11 measurement spots are arranged such that the distance between the centers of adjacent measurement spots is 40 µm along the X axis direction, and 11 measurement spots are arranged such that the distance between the centers of adjacent measurement spots is 40 µm along the Y axis direction. That is, 11 spots for each column and 11 spots for each row, a total of 121 measurement spots are arranged.

Next, the reflectance at a wavelength of 285 nm, which is the reference measurement wavelength, is measured at each measurement spot to calculate the 3σ and average values of reflectance.

Each measurement spot includes a measurement area of 20 µm in diameter.

Figure 7:
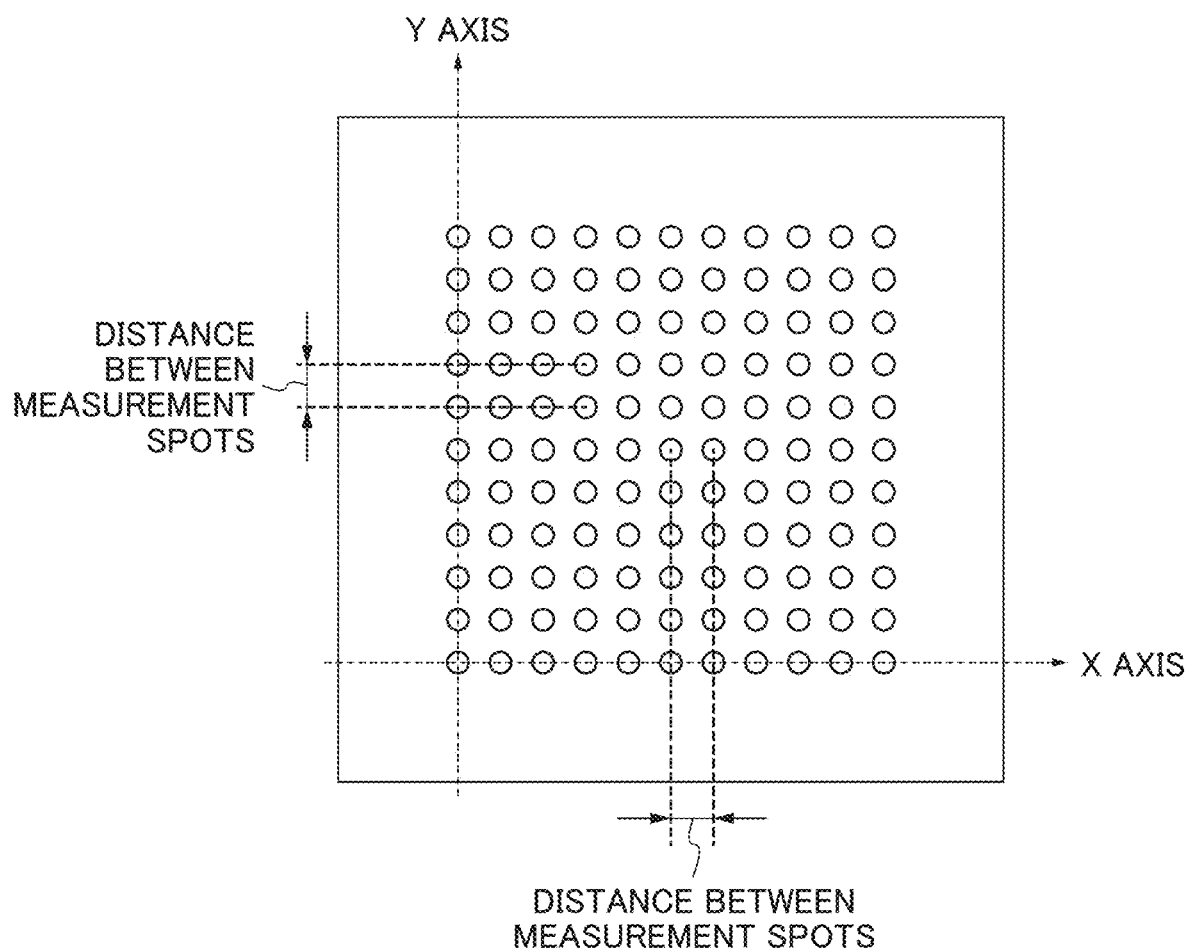
FIG. 7 shows a schematic diagram depicting the arrangement in a measurement position selected for determination of the 3σ and average values of reflectance in the present disclosure.

As a specific example of arrangement of measurement spots, FIG. 7 shows a schematic diagram depicting the arrangement of measurement spots in one of the selected "measurement positions."

A microspectrometer-based film thickness meter (for example, OPTM Model A-1, manufactured by Otsuka Electronics Co., Ltd.) is used as a reflectance measuring device, and a 10× reflective lens or the like is used as a lens, and an aperture with a diameter of 200 µm (the diameter of measurement spots: 20 µm) is used as a device for adjusting the diameter of measurement spots. In addition, an aluminum substrate is used as the reference for the reflection intensity measurement.

The reflectance $Rs(\lambda)$ is determined by the following equation:

$$Rs(\lambda) = \frac{I_s(\lambda)}{I_{ref}(\lambda)} R_{ref}(\lambda).$$

In this equation, $I_s(\lambda)$ and $I_{ref}(\lambda)$, and $R_{ref}(\lambda)$ represent the reflection intensities of a CNT film on a silicon substrate and of a reference, and the absolute reflectance of the reference at the wavelength of $\lambda$, respectively.

When aluminum is used as the reference, the known optical constants of aluminum allows calculation of $R_{ref}(\lambda)$. The conditions such as gain and exposure time are same for measuring the reflection intensities of the reference and the CNT film on the silicon substrate. Thus, the absolute reflectance of the CNT film on the silicon substrate can be determined.

The reflectance at a wavelength of 285 nm is determined using reflection intensities and the absolute reflectance of the reference at a wavelength of 285 nm by the following equation:

$$Rs(285\text{ nm}) = \frac{I_s(285\text{ nm})}{I_{ref}(285\text{ nm})} R_{ref}(285\text{ nm}).$$

When the CNT film disclosed herein is deposited on a silicon substrate and the reflectance of the deposited carbon nanotube film is measured at multiple measurement positions spaced 2 cm or more apart from each other by using a reflectance spectrophotometer-based film thickness meter under the following conditions to calculate the average reflectance of the carbon nanotube film, the value obtained by subtracting the minimum average reflectance from the maximum average reflectance (also referred to herein as "the difference between the maximum and the minimum values of average reflectance") is preferably 15% or less:

<Conditions>
the diameter of measurement spots, 20 μm;
the reference measurement wavelength, 285 nm;
the number of measurement spots, 121 spots;
the distance between the centers of adjacent measurement spots, 40 μm.

When the difference between the maximum and minimum values of average reflectance is 15% or less, the difference in average reflectance can be small among the average reflectance values at the multiple measurement positions spaced 2 cm or more apart from each other. As a result, the CNT film disclosed herein has high film uniformity across a wide area.

From the same points of view as above, the above difference between the maximum and the minimum values of average reflectance is more preferably 12% or less, still more preferably 8% or less.

The lower limit of the difference between the maximum and the minimum values of average reflectance is not specifically limited. For example, the difference between the maximum and the minimum values of average reflectance in the CNT film may be more than 0% or can be 0.1% or more.

[Difference Between Maximum and the Minimum Values of Average Reflectance]

A method for determination of "the difference between the maximum and the minimum values of average reflectance, in which the average reflectance is measured with a reflectance spectrophotometer-based film thickness meter at multiple measurement positions spaced 2 cm or more apart from each other" will be described.

First, a CNT film is deposited on a silicon substrate, leaving no blank space on the silicon substrate.

The diagonal line across the deposited CNT film is defined as the X axis, and multiple "measurement positions" spaced 2 cm or more apart from each other are selected on the X axis.

Each measurement position includes a measurement area of 0.40 mm×0.40 mm.

Figure 8:
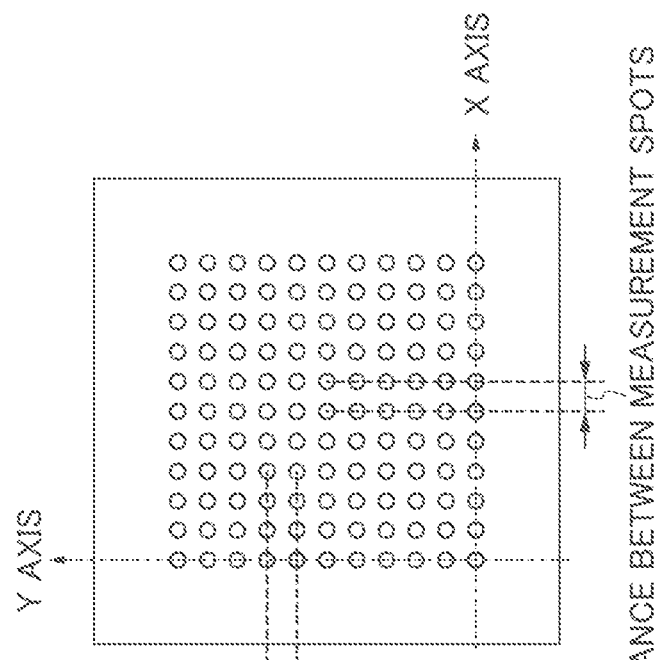
FIG. 8(a) shows a schematic diagram depicting the arrangement of measurement positions selected for determination of the 3σ and average values of reflectance in the present disclosure and FIG. 8(b) shows a schematic diagram depicting the arrangement of measurement spots in each "measurement position" selected for determination of the 3σ and average values of reflectance in the present disclosure.
Figure 8:
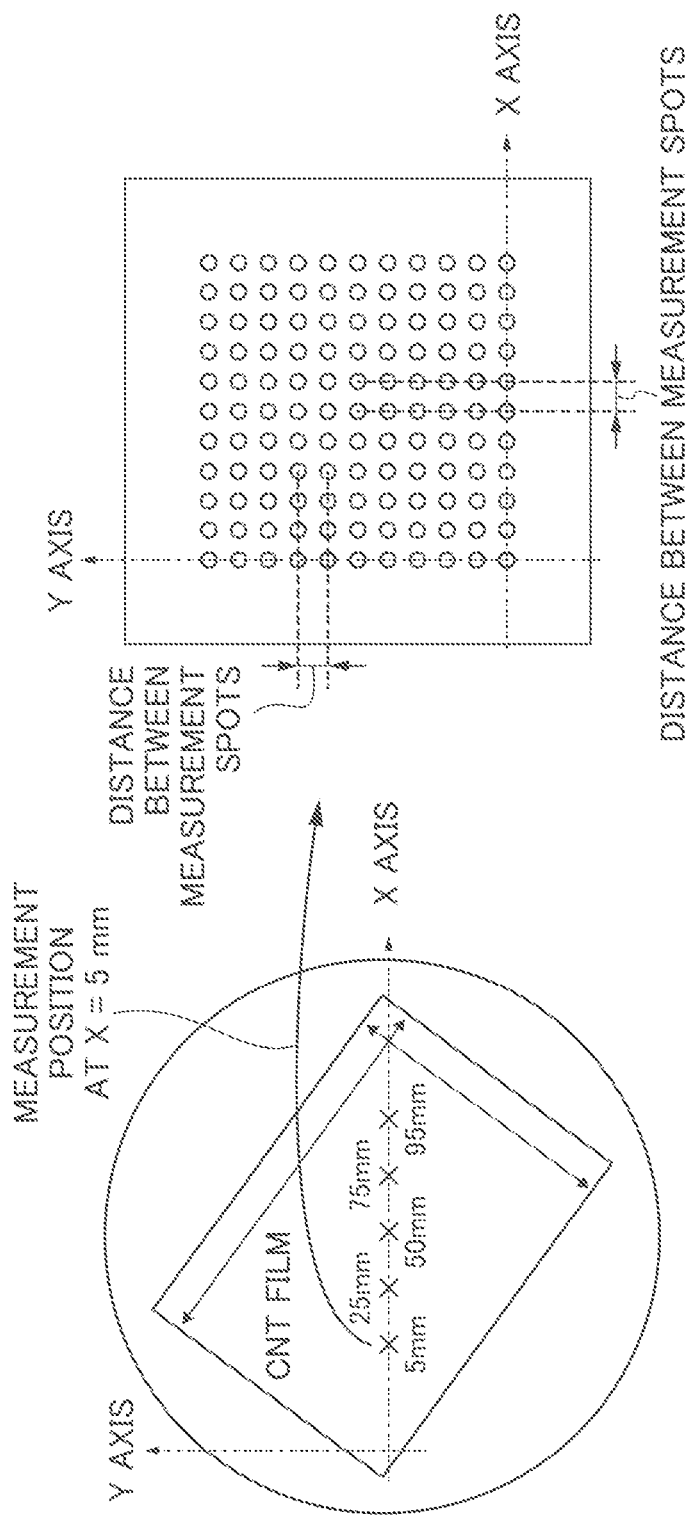

As a specific example of selection of "measurement positions," FIG. 8(a) shows a schematic diagram depicting the arrangement of selected measurement positions. Additionally, FIG. 8(b) shows a schematic diagram depicting the arrangement of measurement spots in each of the selected "measurement positions."

For each of the selected "measurement positions," the reflectance is measured at each measurement spot to calculate the average reflectance by following the method described above in the section [3σ of Reflectance and Average Reflectance].

The difference between the maximum and the minimum values of average reflectance is calculated from the values of average reflectance determined for the "measurement positions".

For example, the number of measurements in each of the multiple measurement positions may be five.

Method of Conversion to Film Thickness (Optical Thickness)

Reflectance spectra in the wavelength range from 200 nm to 600 nm with a wavelength increment of 1 nm to 2 nm are obtained for each of the measurement spots.

Then, the reflectance spectra in the wavelength range from 225 to 500 nm are analyzed by the least square method to calculate the film thickness at each of the measurement spots, in which the optical constant values shown in Table 1 (refractive indexes: n, extinction coefficients: k) are used as the optical constants of the CNT film and a three-layer model consisting of an air layer/a CNT film layer/a silicon substrate is used.

The film thickness at a "measurement position" is defined as the mean of the film thickness values at 121 measurement spots in the "measurement position."

A method for analysis of a reflectance spectrum in the wavelength range from 225 to 500 nm by the least square method to calculate the film thickness at each measurement spot will be described below.

The film thickness is calculated using a three-layer model consisting of an air layer/a CNT film layer/a silicon substrate and using the equations (a) to (c) below.

Figure 9:
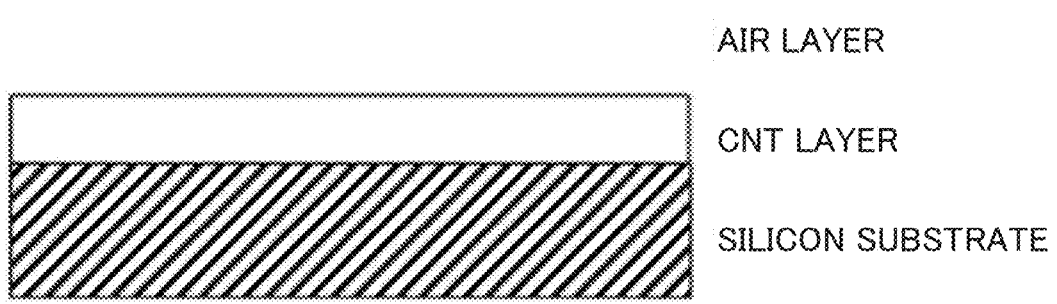
FIG. 9 shows a schematic diagram depicting a model consisting of an air layer/a CNT film layer/a silicon substrate.

FIG. 9 shows a schematic diagram depicting a model consisting of an air layer/a CNT film layer/a silicon substrate.

The reflectance Rs is expressed using an amplitude reflectance $r_s$ by the equation (a) below:

$$R_S = r_s \cdot r_s^* \quad (a)$$

In the above equation, * represents a complex conjugate.

The amplitude reflectance $r_s$ from a combination of three layers, an air layer/a CNT film layer/a silicon substrate, is expressed by the equation (b):

$$r_s = (r_{01} + r_{12} \exp(-i\delta))/(1 + r_{01} r_{12} \exp(-i\delta)) \quad (b)$$

In the above equation, $r_{01}$ represents the amplitude reflectance at the interface between the air layer and the CNT film layer, and $r_{12}$ represents the amplitude reflectance at the interface between the CNT film layer and the silicon substrate layer, and i represents the imaginary unit.

In the above equation, $\delta$ represents the phase shift generated when the light with the wavelength $\lambda$ passes forward and backward through the film once, represented by the equation (c) below:

$$\delta = \left(\frac{4\pi}{\lambda}\right) Nd \cos\phi \cdot (c).$$

In the above equation, d represents the film thickness, and N represents a complex refractive index (N=n−ik), and φ represents the incident angle. In addition, i represents the imaginary unit.

The above equations (a) to (c) are used to determine the film thickness based on the least square method, in which the film thickness represented by the variable d is calculated from the reflectance Rs in the wavelength range from 225 to 500 nm.

Figure 10:
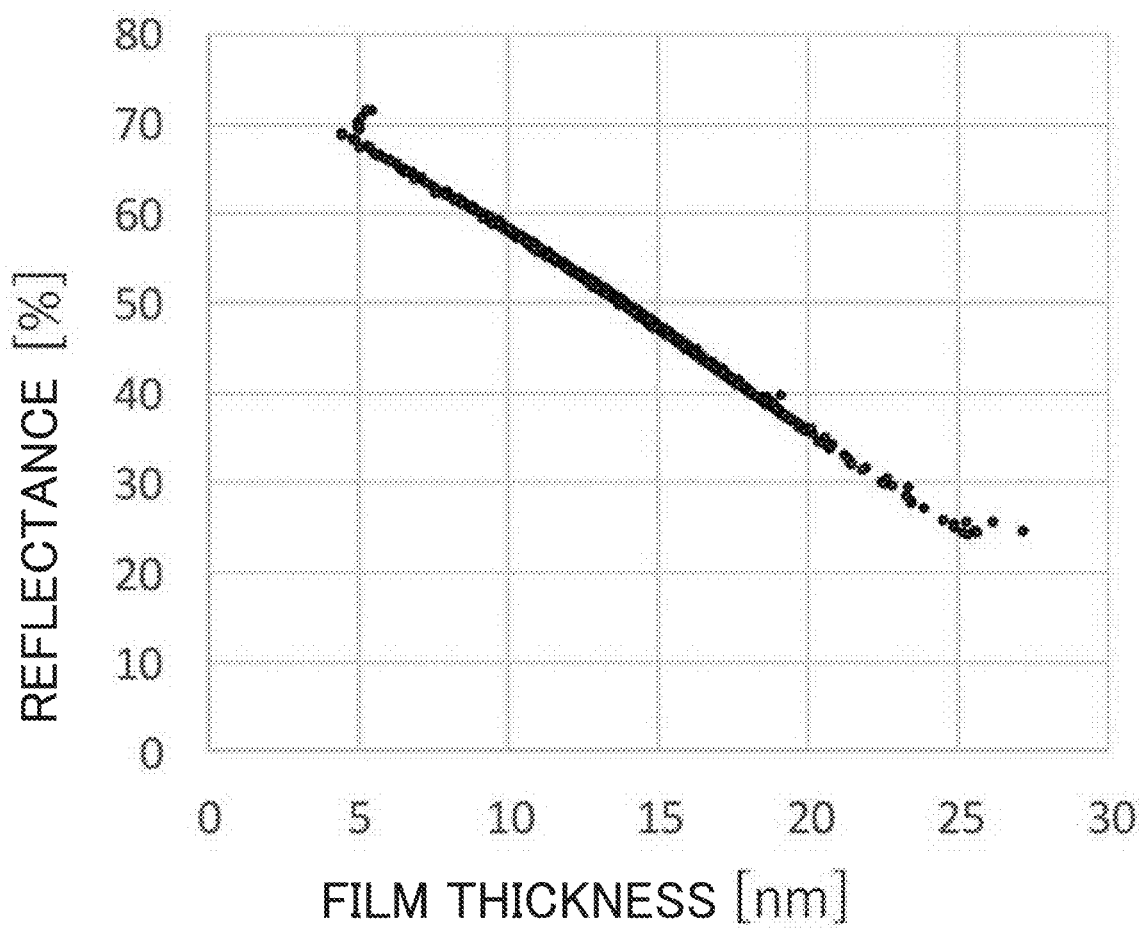
FIG. 10 shows a graph created by plotting the relationship between the reflectance and the film thickness, where the reflectance at a wavelength of 285 nm is measured and the film thickness is determined from the measured value of reflectance by a method for conversion to film thickness according to the present disclosure.

FIG. 10 shows a graph created by plotting the relationship between the reflectance and the film thickness in a sample produced by transferring a less uniform CNT film to a silicon substrate, where the reflectance at a wavelength of 285 nm is measured and the film thickness is determined from the measured value of reflectance by the above method.

As shown in FIG. 10, the difference in film thickness can be determined with high accuracy from the difference in reflectance by the above method.

TABLE 1

| [nm] | n | k |
|------|------|------|
| 225 | 1.20 | 0.61 |
| 248 | 1.34 | 0.75 |
| 276 | 1.52 | 0.76 |
| 310 | 1.64 | 0.72 |
| 354 | 1.71 | 0.68 |
| 413 | 1.75 | 0.68 |
| 496 | 1.81 | 0.70 |

The CNT film disclosed herein has a thickness from 1 nm to 50 nm.

As the thickness increases is 1 nm or more, the mechanical strength can be increased.

As the thickness is 50 nm or less, the CNT film disclosed herein can keep a transmittance of 80% or more as well as be free-standing without any supporting material when used, for example, as a pellicle film.

In view of protecting the pellicle film from any damage and from foreign bodies (that is, preventing penetration of foreign bodies into the pellicle film), the pellicle film preferably has a thickness of 5 nm or more, more preferably 10 nm or more, still more preferably 20 nm or more.

In view of ensuring a high transmission of EUV light, the pellicle film preferably has a thickness of 40 nm or less, more preferably 30 nm or less, still more preferably 20 nm or less.

The thickness of a CNT film is measured by the following method.

The reflectance is measured with a reflectance spectrophotometer-based film thickness meter at multiple measurement positions spaced 2 cm or more apart from each other, according to the method described above in the section [Difference between Maximum And The Minimum Values of Average Reflectance]. However, the conditions for the reflectance measurement are as described below:
<Conditions>
  the diameter of measurement spots, 20 μm;
  the measurement wavelength range, 200 nm to 600 nm (a wavelength increment: 1.3 to 1.5 nm);
  the number of measurement spots, 121 spots;
  the distance between the centers of adjacent measurement spots, 40 μm.

Then, the film thickness at each measurement spot is calculated by the method described above in the section "Method of Conversion to Film Thickness (Optical Thickness)." Moreover, the film thickness values at the measurement spots (121 spots) in each measurement position are averaged to calculate the film thickness value at each measurement position.

Then, the film thickness values calculated for the measurement positions are averaged, and the obtained value is defined as the thickness of the CNT film.

In addition, the σ of the film thickness at each measurement position is similarly calculated from the standard deviation values of film thickness at the measurement spots.

(Transmittance)

The CNT film disclosed herein transmits 80% or more of EUV light at a wavelength of 13.5 nm. More preferably, the CNT film disclosed herein transmits 90% or more of EUV light at a wavelength of 13.5 nm.

The transmittance Tr of EUV light through the pellicle film is measured with a photodiode. Specifically, the transmittance is determined from the current values detected when the pellicle film is not mounted (incident light intensity $I_0$) and detected when the pellicle film is mounted (transmitted light intensity I), based on the following equation (2):

$$Tr = I/I_0 \qquad (2)$$

The EUV transmittance tends to decrease linearly as the film thickness increases.

Figure 11:
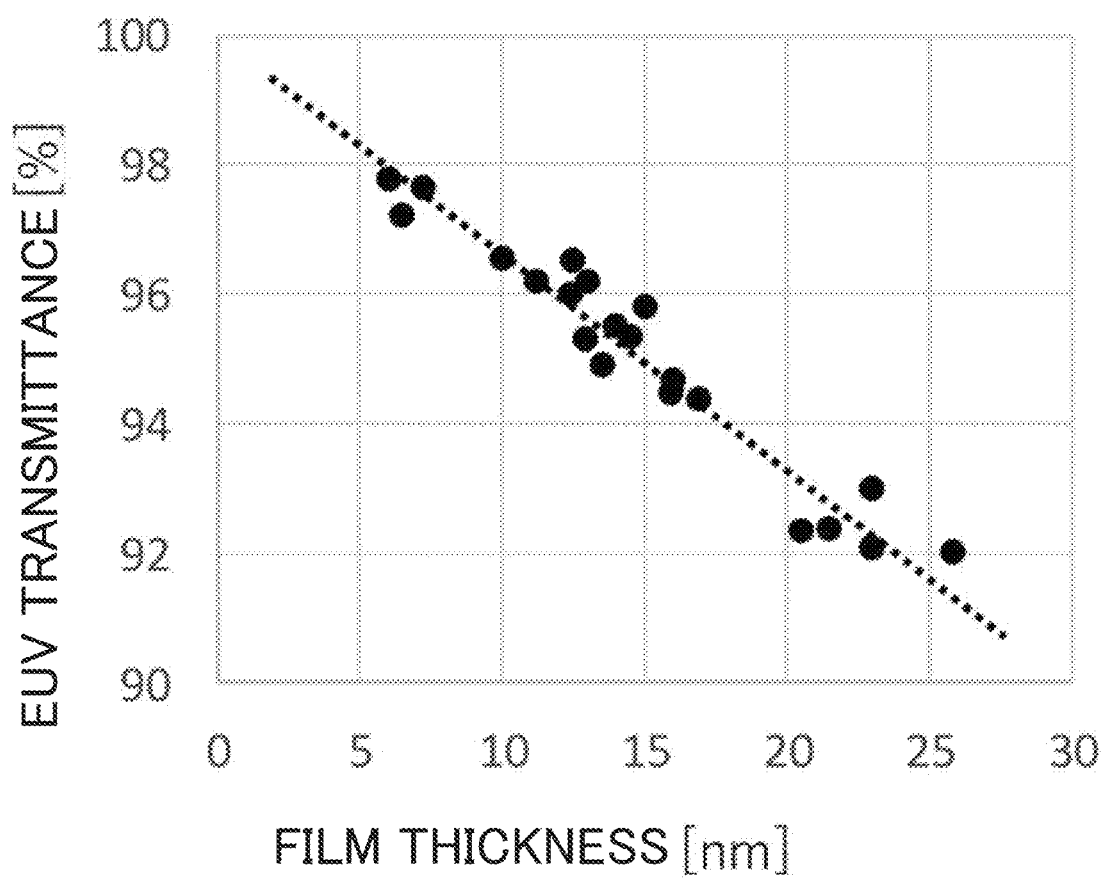
FIG. 11 shows a graph depicting the relationship between the EUV transmittance and the film thickness.

FIG. 11 shows a graph depicting the relationship between the EUV transmittance and the film thickness.

Figure 12:
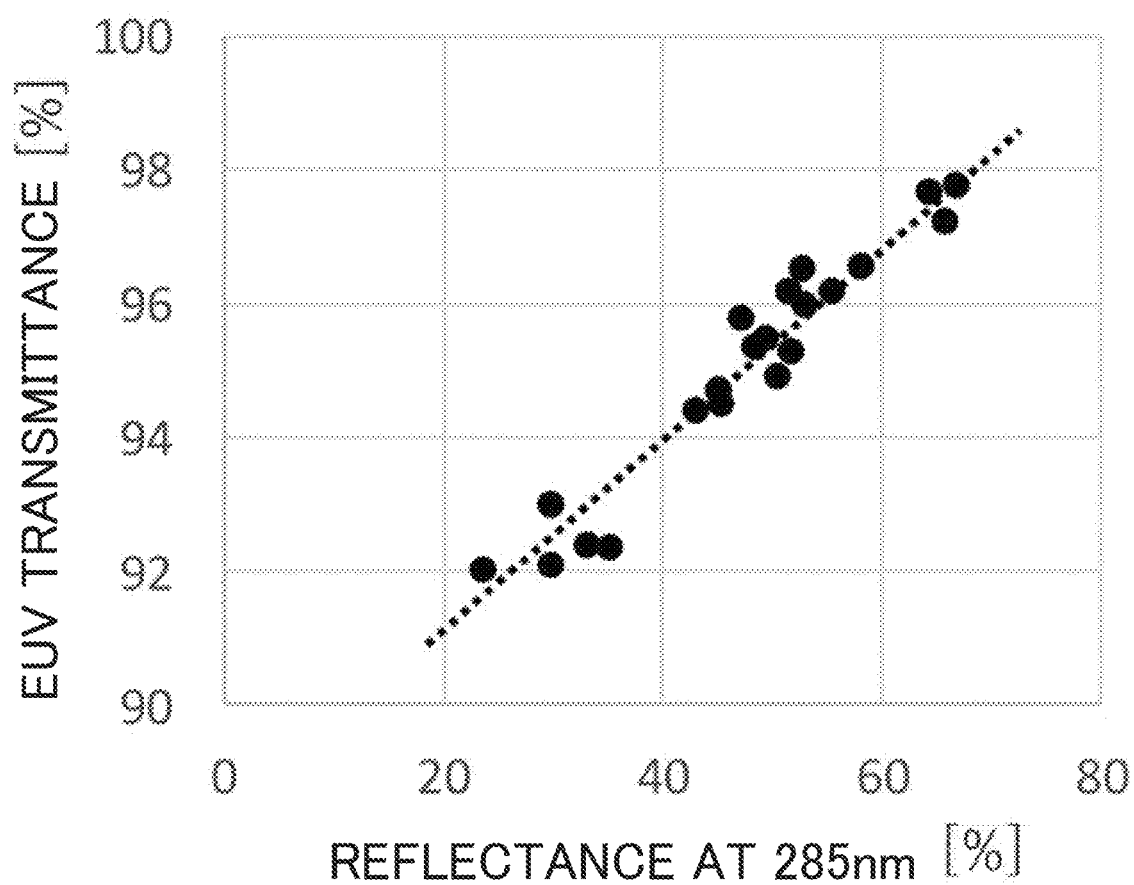
FIG. 12 shows a graph depicting the relationship between the reflectance at a wavelength of 285 nm and the EUV transmittance.

Moreover, FIG. 12 shows a graph depicting the relationship between the reflectance at a wavelength of 285 nm and the EUV transmittance.

For the CNT film of the disclosure, the breaking load determined by the nanoindentation test is preferably 1.0 μN/nm or more, more preferably 2.0 μN/nm or more, still more preferably 3.0 μN/nm or more, from the viewpoint of mechanical strength.

The upper limit of the breaking load is not specifically limited. For example, the breaking load determined by the nanoindentation test for the CNT film of the disclosure may be 40.0 μN/nm or less, or 20.0 μN/nm or less, or 10.0 μN/nm or less.

[Nanoindentation Test]

First, a silicon wafer that has a circular hole with a depth of 30 μm or more and a diameter of 80 μm is prepared for indentation test.

Next, the pellicle film is floated on the surface of a liquid, such as water, an acidic or basic solution in water, or an organic solvent, and then picked up with the above-described silicon wafer for indentation test in such a manner that the CNT film (that is, the pellicle film) is laid across the circular hole, to produce a test sample that partially has the CNT film with free-standing structure.

Next, a load is applied to the CNT film by pressing a conical indenter (R=10 μm) at a speed of 1 μm/s into the center of the area of the CNT film covering the circular hole. Then, the applied load at the yield point where plastic deformation or fracture begins is measured when plastic deformation or fracture appears in the CNT film. The measured applied load is divided by the film thickness to calculate the breaking load, from which the film strength is determined. The nanoindentation test is performed, for example, using a nanoindentation tester ENT-2100 manufactured by ELIONIX Inc.

The CNT film 100 included in a pellicle film for photolithography can have a mesh structure. That is, multiple CNTs 102 can be intertwined with each other in a mesh-like configuration to form a mesh structure in the CNT film 100.

Additionally, the CNT film 100 can have pores. That is, the pores can be formed by intertwining of the CNTs 102.

In view of preventing a microscopic concentration of stress to increase the mechanical strength of the CNT film, it is desirable that the distribution of the pores be uniform.

In other words, the presence of a structure with homogeneous pores in the CNT film allows the film to have an increased mechanical strength. The presence of the structure with homogeneous pores in the CNT film, that is, a narrow distribution of pores in the CNT film results in, for example, higher tensile strength.

The CNT film is formed by intertwining of CNT bundles and has a membrane structure similar to that observed in materials such as polymer, paper, non-woven fabric, and porous materials. If the pores in the CNT film are large in volume, each of the large pores may act as a fracture origin and facilitate fracture of the film. If the pores are small in volume, the variation in tensile strength, for example, measured in the tensile test will be reduced.

The CNT assembly 101 may include a single layer of CNTs 102 or two layers of CNTs 102.

In addition, the CNT assembly 101 is preferred to contain CNT bundles whose thickness is distributed with a relative standard deviation of 30% or less.

The thickness of each CNT bundle is measured by the following method.

Figure 13:
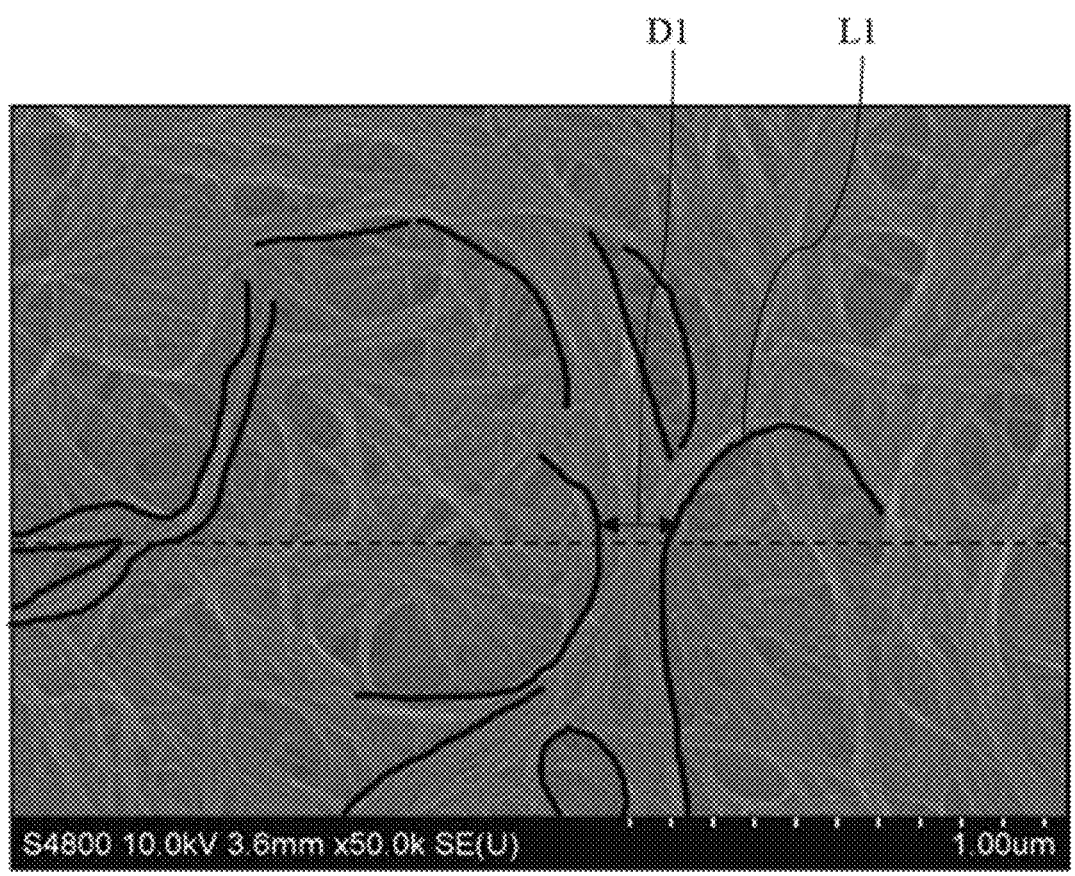
FIG. 13 shows a schematic illustration depicting a method for measuring the diameter of a CNT bundle in a CNT assembly according to one embodiment of the disclosure.

FIG. 13 shows a schematic illustration depicting the method of measuring the diameter of a CNT bundle. The method of measuring the diameter of a CNT bundle is as described below:

(1) Draw profile lines L1; (2) measure the distance D1 perpendicular to the two profile lines in the same CNT bundle to determine the diameter of the bundle; (3) avoid measuring the diameter of the bundle at sites near branching and merging nodes in the bundle; (4) the tangent lines to the two profile lines at the points between which the diameter of the bundle is measured will intersect with each other at an angle of not more than 15° or are parallel as a requirement; (5) draw a straight line across an image from one end to the other, and measure the diameter of CNT bundles crossing the transversal line, which is to avoid measuring the same bundle multiple times. Moreover, the profile lines may be determined by eyes in this evaluation.

<CNTs>

The CNT film disclosed herein contains CNTs.

Preferably, the CNTs have a tube diameter from 0.8 nm to 6.0 nm.

The tube diameter from 0.8 nm to 6.0 nm ensures a high transmission of EUV light when the CNT film disclosed herein is used, for example, as a pellicle film.

Preferably, the CNTs have a length of 10 nm or more.

The CNT length of 10 nm or more allows CNTs to be intertwined with each other in an appropriate manner to form a CNT film with high mechanical strength.

The upper limit of the CNT length is not specifically limited, and the upper limit of the length may be, for example, 10 cm.

The tube diameter and length of CNTs are the arithmetic mean values of 20 or more carbon materials (primary particles) measured by electron microscopy.

An electron microscope, such as a scanning electron microscope (SEM) or a transmission electron microscope (TEM), can be used.

The pellicle film of the disclosure for photolithography preferably contains CNTs having an effective length of 0.1 μm or more, more preferably 0.5 μm or more, still more preferably 1.0 μm or more, in view of increasing the strength of the pellicle film.

The upper limit of the effective length of CNTs is not limited. For example, the effective length of CNTs may be 30 μm or less, or 20 μm or less, or 10 μm or less.

(Measurement of Effective Length of CNTs)

The effective length of CNTs is measured by the following method.

First, a Fourier transform infrared spectrophotometer (for example, FT-IR spectrometer VERTEX 80V, Bruker Corporation) is used to measure the far infrared spectrum of the CNT film.

Second, the CNT film is transferred onto a high-resistivity Si substrate (namely, with low carrier density).

CNT channels having "CNT effective lengths" and consisting of conductive paths affected by kinks, defects, or the like are estimated based on the peak values of the plasmon resonance to evaluate the effective lengths of CNTs according to the methods described in the references [21] to [23] below. The average tube diameter is used for calculation of the effective length of CNTs. The average tube diameter can be determined by a method for determining the average diameter of CNTs in an image of CNTs taken by an electron microscope.

[21] T. Nakanishi, T Ando, Optical Response of Finite-Length Carbon Nanotubes, J. Phys. Soc. Japan. 78 (2009) 114708.

[22] T Morimoto, S. K. Joung, T. Saito, D. N. Futaba, K. Hata, T. Okazaki, Length-dependent plasmon resonance in single-walled carbon nanotubes, ACS Nano. 8 (2014) 9897-9904.

[23] T. Morimoto, T. Okazaki, Optical resonance in far-infrared spectra of multiwalled carbon nanotubes, Appl. Phys. Express. 8 (2015).

Examples of a method for increasing the effective length of CNTs include a method in which CNTs with less kinks, defects, or the like are used. The CNTs with less kinks, defects, or the like may be CNTs with high crystallinity and high linearity.

Additionally, the example also includes a method in which CNTs with a G/D of 10 or more (or 20 or more) and with kinks of 100 nm or more in length are used.

Moreover, the example also includes a method that avoids increasing or accumulating damage, defects, or the like in CNTs during the production of a dispersion from raw CNTs and a solvent. Specifically, the method that avoids increasing or accumulating damage, defects, or the like in CNTs may be a method that appropriately controls ultrasonic dispersion or mechanical shearing in terms of time, intensity, and temperature.

The CNT film of the disclosure preferably has a G/D ratio of 10 or more when measured by resonant Raman scattering measurement.

When the above-described G/D ratio is 10 or more, a CNT film containing well-graphitized CNTs can be obtained, and such a CNT film can have high mechanical strength.

A laser with a wavelength of 532 nm is used for performing the resonant Raman scattering measurement, for example, with a XploRA manufactured by HORIBA Scientific, HORIBA Ltd.

Additionally, the CNT assembly 101 is preferred to contain CNT bundles which are evenly dispersed at regular intervals.

The dispersion in the CNT assembly 101 can be confirmed, for example, by fast Fourier transform (FFT) of a SEM image.

In the FFT image, areas located closer to the center and located farther from the center indicate, respectively, lower-frequency and higher-frequency periodic structures in the original image. In addition, the pixel distance and the intensity in the FFT image may be used in fitting for the analysis. In this case, the following equation (Ornstein-Zernike equation) may be used:

$$I = A/(1+(B*v)) + C$$

In the above equation, I represents the intensity, and v represents the pixel distance. A, B, and C are fitting coefficients.

(Protective Layer)

Preferably, the pellicle film of the disclosure for photolithography further includes a protective layer that is placed in contact with the CNT film.

The presence of a protective layer in the pellicle film of the disclosure for photolithography can increase the resistance to hydrogen radicals (that is, reduction resistance) and to oxidation.

Figure 14:
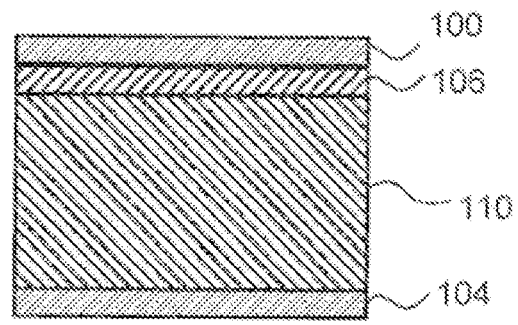
FIG. 14(a) shows a diagram depicting a pellicle in which a protective layer 106 is placed between a CNT film 100 and a substrate 110.
FIG. 14(b) shows a diagram depicting a pellicle in which a protective layer 106 is placed on a surface of a CNT film 100 on the side of a photolithography mask 202.
FIG. 14(c) shows a diagram depicting a pellicle laminated with a photolithography mask 181, in which a protective layer 106 is placed between a CNT film 100 and a substrate 110.
Figure 14:
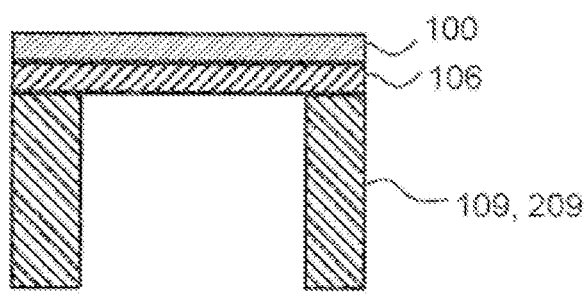
Figure 14:
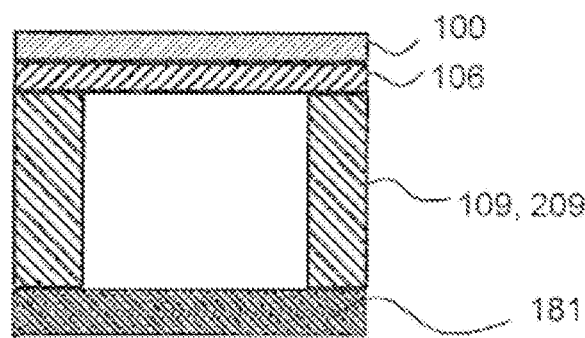

In FIG. 14(a), a protective layer 106 can be placed in contact with a CNT film and may be, for example, placed on a surface of a CNT film 100 on the side of a photolithography mask, placed between a CNT film 100 and a substrate 110, deposited as the uppermost layer on a CNT film 100, or any combination of these arrangements.

Because hydrogen radicals can be generated on both surfaces of the pellicle film, it is preferable to combine the above-described arrangements. That is, it is preferable that the protective layer 106 is formed on a surface of the CNT film 100 on the side of a photolithography mask and is also deposited as the uppermost layer on the CNT film 100.

FIG. 14(b) shows a diagram depicting a pellicle in which a protective layer 106 is placed on a surface of a CNT film 100 on the side of a photolithography mask and FIG. 14(c) shows a diagram depicting a pellicle laminated with a photolithography mask 181, in which a protective layer 106 is placed between a CNT film 100 and a substrate 110.

Preferably, the protective layer 106 contains at least one component selected from the group consisting of $SiO_x$ (x≤2), $Si_aN_b$ (a/b=0.7-1.5), SiON, $Y_2O_3$, YN, Mo, Ru, Rb, Sr, Y, Zr, Nb, $B_4C$, SiC, and Rh.

The protective layer preferably has a film thickness from 1 nm to 10 nm, more preferably from 2 nm to 5 nm, to avoid preventing transmission of EUV light.

When the film thickness of the protective layer is from 1 nm to 10 nm, EUV light absorption by the protective layer can be reduced, which in turn reduces reduction of transmittance.

Preferably, the ratio of the film thickness of the protective layer to that of the pellicle film is from 0.03 to 1.0. When the ratio is within the above-described numerical range, EUV light absorption by the protective layer can be reduced, which in turn reduces reduction of transmittance.

Additionally, deposition of a protective layer may likely cause reduction of transmittance due to reflection of EUV light occurring at newly generated interfaces between layers, that is, an interface between a protective layer and air and an interface between a protective layer and a pellicle film. The reflectance of EUV light at these interfaces between layers can be calculated as a function of the thickness of the pellicle film and the protective layer and of the elemental composition of the pellicle film and the protective layer. Furthermore, the reflectance can be reduced by optimizing the thickness of the films, similarly to the principle of anti-reflective films.

The thickness uniformity and the surface roughness are not specifically limited for the protective layer. Moreover, the protective layer may be in either a continuous form or a sea-island form.

<<Pellicle>>

A pellicle of the disclosure includes a pellicle film of the disclosure for photolithography and a supporting frame for supporting the pellicle film for photolithography.

Figure 15:
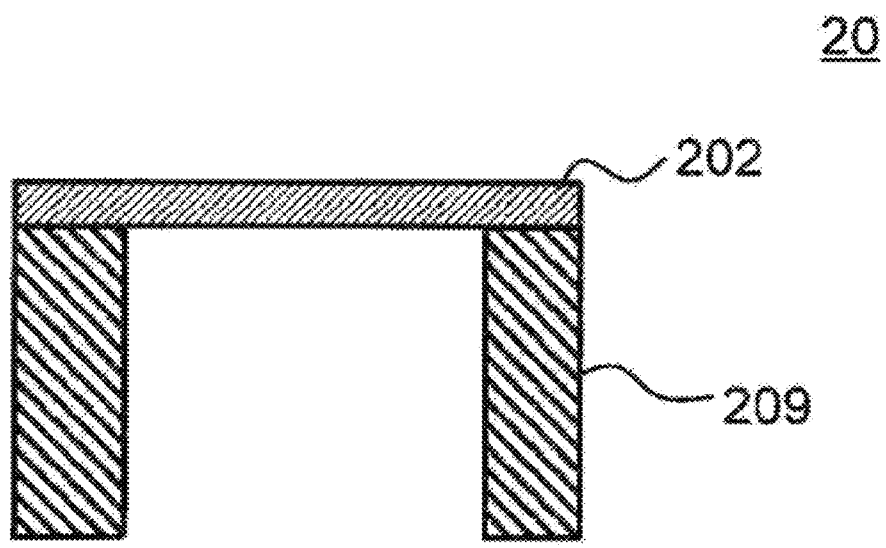
FIG. 15 shows a schematic illustration (a cross-sectional diagram) of a pellicle according to one embodiment of the disclosure.

In a pellicle of the disclosure, a pellicle film 202 is supported by a supporting frame 209. A method of producing a pellicle 20 according to the present disclosure will be described using FIG. 15.

CNTs are formed on a substrate, such as a silicon wafer, a glass substrate, a metal substrate, or a polymer film. The obtained CNTs are removed from the substrate by floating the CNTs on the surface of a liquid, such as water, an acidic or basic solution in water, or an organic solvent. A film of the CNTs floated on the liquid surface is picked up with and fixed on a supporting frame coated with, for example, an adhesive. The obtained CNT film becomes the pellicle film 202.

In view of increasing the uniformity of the pellicle film, the substrate used for the CNT formation preferably has a roughness Ra of 100 nm or less, more preferably 10 nm or less, still more preferably 1 nm or less.

A technique for transferring graphene or others may be used as a method for obtaining a free-standing film, in which the film is floated on and picked up from the liquid surface.

For example, in a case in which a CNT film floated on the liquid surface is picked up from the liquid surface, the CNT film may be picked up with and fixed on a supporting frame coated with, for example, an adhesive, while supported with a substrate, such as a polymer film. The CNT film can be recovered by etching off the substrate, such as a polymer film.

As a film with sufficient strength, a bulk CNT material formed on a substrate for use in chemical vapor deposition (CVD) may be mechanically removed from the substrate and becomes the pellicle film 202. The support of the supporting frame 209 for the pellicle film 202 is not limited to a specific method, and a method that is similarly applied to conventional pellicles may be used.

A metal catalyst used for the CNT formation can be a cause of reduction of EUV transmittance, but the removal of the CNTs from the substrate for use in chemical vapor deposition preferably results in the pellicle film 202 containing little of the metal catalyst used for the CNT formation.

The shape, size, and material of the supporting frame 209 are not specifically limited. The material of the supporting frame 209 can be the same as that used for a second frame.

Other embodiments of the pellicle include, for example, [Embodiment 1] and [Embodiment 2] disclosed in WO2018/008594.

<<Photolithography Mask>>

A photolithography mask of the disclosure includes a photomask and a pellicle of the disclosure placed on a patterned surface of the photomask.

The photolithography mask of the disclosure includes the pellicle of the disclosure and thus has the same effect as the pellicle of the disclosure.

The attachment of the photomask to the pellicle of the disclosure is not limited to a specific method. For example, the photomask may be attached to the supporting frame directly or via a photomask-directed adhesive layer on one side of the supporting frame, or the photomask may be fixed to the supporting frame by a mechanical fastening method or the attracting force of magnet or others.

In this respect, a photomask including a supporting substrate, a reflective layer deposited on the supporting substrate, and an absorber layer formed on the reflective layer can be used as the photomask.

Partial absorption of EUV light by the absorber layer will result in formation of a desired image on a sensitive substrate (for example, a semiconductor substrate with a photoresist film). The reflective layer may be a multilayer film composed of molybdenum (Mo) and silicon (Si). Chromium (Cr), tantalum nitride, or the like can be used for the absorber layer from the viewpoint of high absorbability for light such as EUV.

<<Photolithography System>>

A photolithography system of the disclosure includes a photolithography mask of the disclosure and thus has the same effect as the photolithography mask of the disclosure.

The photolithography system of the disclosure includes a light source that emits illumination light, a photolithography mask of the disclosure, and an optical system that guides the illumination light emitted from the light source to the photolithography mask, in which the photolithography mask is preferably mounted such that the illumination light emitted from the light source passes through the pellicle film and illuminates the photolithography mask.

Preferably, the above-described illumination light is EUV light.

The above-described aspects provide formation of a finer pattern (for example, a pattern with a line width of 32 nm or less) by, for example, EUV light and additionally allow exposure of a pattern, while improving the low resolution due to the presence of foreign bodies, even under use of EUV light, which is associated with a tendency to bring a problem of low resolution due to the presence of foreign bodies.

<<Method of Producing Pellicle Film for Photolithography>>

A method to produce a pellicle film for photolithography in this disclosure is a method of producing the pellicle film of the disclosure for photolithography as described above, and the method includes the steps of preparing raw carbon nanotubes including aggregates (preparation step); mixing the raw carbon nanotubes with a solvent to produce a dispersion (also referred to as "raw carbon nanotube dispersion production step" or as "raw CNT dispersion production step"); removing the aggregates contained in the dispersion to obtain refined carbon nanotubes (also referred to as "refined carbon nanotube production step" or as "refined CNT production step"); and forming a sheet from the refined carbon nanotubes to produce a carbon nanotube film (also referred to as "carbon nanotube film production step" or as "CNT film production step").

A method of producing the CNT film 100 will be described below using FIG. 16 and FIG. 17.

[Preparation of Substrate]

Figure 16:
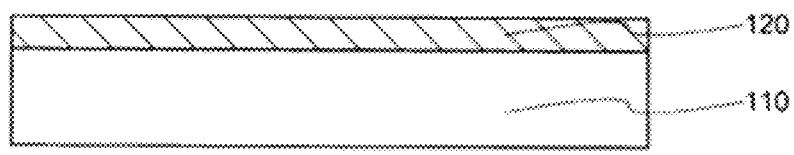
FIG. 16 shows a cross-sectional diagram depicting a method of producing a CNT film according to one embodiment of the disclosure.

First, a substrate 110 is prepared as shown in FIG. 16. For example, a silicon (Si) wafer is used as the substrate 110. A ground layer 120 may be formed on the substrate 110, as shown in FIG. 16. The ground layer 120 is formed by a method such as spattering, CVD, or thermal oxidation. For example, a silicon nitride (SiN) film formed by CVD is used as the ground layer 120. The substrate 110 and the ground layer 120 may be collectively called the substrate 110. A different film may be formed on the ground layer 120.

<Preparation Step>

The preparation step is the step of preparing raw CNTs including aggregates.

The raw CNTs can be used without specific limitations, as long as aggregates are included in the CNTs.

For example, a commercial product such as eDIPS manufactured by MEIJO NANO CARBON Co., Ltd., ZEO-NANO manufactured by Zeon Nanotechnology Co., Ltd., or TUBALL manufactured by OCSiAl S.A. may be purchased, or raw CNTs can be synthesized.

Examples of a method for synthesizing raw CNTs include the enhanced direct injection pyrolytic synthesis (hereinafter also referred to as "eDIPS") method, the super-growth method, and the laser ablation method.

Among those methods, the eDIPS method is preferred as a method of synthesizing raw CNTs.

Raw CNTs synthesized by the eDIPS method have a narrower diameter distribution and show higher crystallinity and higher linearity.

Thus, CNT bundles and a mesh structure made of CNT bundles are composed of the CNTs with high crystallinity, that is, the CNTs with a low defect density. Moreover, the size of bundles and the distribution of mesh nodes can be made uniform. Consequently, a CNT film with higher surface uniformity and high toughness can be obtained.

Additionally, synthesis of raw CNTs by the dry processing method can lead to reduced aggregation of CNT bundles and therefore can provide CNT bundles with a smaller diameter and a CNT film with a smaller thickness.

[eDIPS Method]

The eDIPS method is an improved form of the direct injection pyrolytic synthesis method (hereinafter also referred to as "the DIPS method") for CNT synthesis.

The DIPS method is a gas-phase fluidized-bed method, in which a hydrocarbon-based solution containing a catalyst (or a catalyst precursor) and a reaction promoter is atomized by a spray gun and the resulting mist of the solution is fed into a furnace to synthesize single-wall CNTs in the flowing gas phase.

The eDIPS method is a method developed focusing on a process to produce particles of different sizes from ferrocene used as a catalyst for the upstream and downstream sections of a reacting furnace, in which a second carbon source that is relatively easily degradable, that is, ready for being a carbon source is mixed in a carrier gas to control nucleation points of single-wall CNTs, which is different from the DIPS method in which an organic solvent is used as a sole carbon source.

For detail on the production, see Saito et. al., J. Nanosci. Nanotechnol., 8 (2008) 6153-6157.

As an example, the product manufactured under the name of "MEIJO eDIPS" by MEIJO NANO CARBON Co., Ltd. is a commercially available CNT product synthesized by the eDIPS method.

<Raw CNT Dispersion Production Step>

The raw CNT dispersion production step is the step of mixing the raw CNTs with a solvent to produce a dispersion.

(Dispersion)

The dispersion is used for the production of the CNT film disclosed herein.

The dispersion contains the raw CNTs obtained in the preparation step.

In the dispersion, the raw CNTs exist as small crushed pieces and form a CNT assembly.

The dispersion may have a form of a highly viscous paste, if necessary.

The dispersion may contain a dispersing agent in addition to the raw CNTs.

The dispersing agent is used to loosen thick bundles of raw CNTs. In addition, a low-molecular-weight dispersing agent is suitable for use in a case in which removal of a dispersing agent is required after formation of a film.

Examples of the dispersing agent include flavin derivatives, sodium cholate, sodium deoxycholate, sodium dodecylbenzenesulfonate, polyacrylic acid, and sodium polyacrylate.

Examples of the flavin derivatives include a flavin with an organic side chain represented by the formula below.

The flavin with an organic side chain is a dispersing agent that can distinguish between semiconductor CNTs and metallic CNTs hand has an effect to loosen CNT bundles. The flavin with an organic side chain is preferable in view of dispersing a large amount of fine particles of aggregates in the solvent.

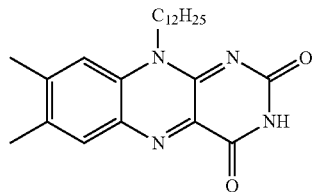

For the dispersing agent, a polyfluorene (poly(9,9-dioctylfluorenyl-2,7-diyl)) may be used as a molecule that can distinguish between semiconductor CNTs and metallic CNTs.

As the dispersing agent, a known surfactant, such as sodium dodecylsulfate, may be used.

(Solvent)

The dispersion contains a solvent in addition to the CNTs. The solvent is not specifically limited.

For example, in a case in which a flavin with an organic side chain is used as the dispersing agent, toluene, xylene, ethyl benzene, or the like can be used as the solvent In a case in which a surfactant is used as the dispersing agent, water (including deuterium water) can be used as the solvent.

In a case in which no dispersing agent is used, an organic solvent, such as n-methylpyrrolidone, N,N-dimethylformamide, propylene glycol, or methyl isobutyl ketone, can be used as the solvent.

Examples of a method for mixing raw CNTs and a solvent to produce a dispersion include a method using cavitation (the ultrasonic dispersion method), a method in which a shearing force is mechanically applied (with a ball mill, a roller mill, a vibration mill, a kneader, a homogenizer, or the like), and a method in which turbulence is used (with a jet mill, a nanomizer, or the like).

By any of the above-described methods, the raw CNTs can be pulverized into fine pieces and then dispersed in the solvent. Thus, an obtained dispersion can keep a high concentration of CNTs even after the refined CNT production step.

Pulverization of the raw CNTs into ultrafine pieces could result in accumulation of damage in the CNT and lead to reduced strength in a produced pellicle film. Thus, it is desired to adjust the processing time, the intensity, the temperature, and the like to appropriate levels to prevent the strength of the pellicle film from dropping.

<Refined CNT Production Step>

The refined CNT production step is the step of removing the aggregates contained in the dispersion to obtain refined carbon nanotubes.

Once the refined CNT production step is performed, refined CNTs, from which highly cohesive nanotube fibers have been removed, can be obtained. The refined CNTs can be used for CNT film production to obtain a CNT film with high thickness uniformity.

Examples of a method for removing the aggregates contained in the dispersion include a method in which the aggregates contained in the dispersion are precipitated.

Specific examples of the method include static standing, filtration, membrane separation, centrifugation, and ultracentrifugation.

Among those methods, ultracentrifugation is preferred as the method of removing the aggregates contained in the dispersion because ultracentrifugation is highly efficient in removal of aggregates. That is, ultracentrifugation is preferably used in the step of obtaining refined carbon nanotubes.

Preferably, the ultracentrifugation is performed at an average relative centrifugal force of 3,000×g or more.

When the average relative centrifugal force is 3,000×g or more, removal of finer aggregates can be provided, which in turn increases the uniformity of a produced pellicle film.

From the same points of view as above, the average relative centrifugal force is more preferably 5,000×g or more.

In this respect, the average relative centrifugal force refers to the average of centrifugal forces generated by centrifugation at a certain speed, that is, the relative centrifugal force at the halfway point between the maximum and the minimum radii.

Preferably, the ultracentrifugation is performed at an average relative centrifugal force of 200,000×g or less.

When the average relative centrifugal force is 200,000×g or less, generation of aggregates and sedimentation of the dispersed CNTs in the dispersion due to an excessively high relative centrifugal force can be reduced.

From the same points of view as above, the average relative centrifugal force is more preferably 150,000×g or less.

Additionally, a duration from 5 minutes to 180 minutes is preferred as the centrifugation time, during which a desired relative centrifugal force is maintained after the relative centrifugal force is achieved.

<CNT Film Production Step>

The CNT film production step is the step of forming a sheet from the refined CNTs to produce a CNT film.

[Film Formation]

A sheet is formed from the refined CNTs. This allows formation of a CNT film.

Figure 17:
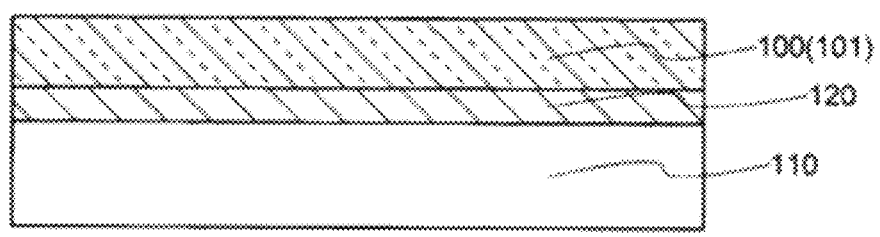
FIG. 17 shows a cross-sectional diagram depicting a method of producing a CNT film according to one embodiment of the disclosure.

As shown in FIG. 17, the CNT film 100 is formed on the ground layer 120. Specifically, the ground layer 120 is coated with a dispersion containing CNT assemblies, and a solvent in the dispersion is then removed by drying or the like to form the CNT film 100. A dispersing agent in the dispersion may be washed off, for example, with a solvent that dissolves the dispersing agent, if necessary.

As a coating method, a suitable method may be used depending on the viscosity or the concentration of CNT assemblies. For example, a coating method, such as the blade coating method, the slit coating method, the spin coating method, or the dip coating method, may be used. Because a CNT film is formed by the coating process, the area, thickness, and the like of the obtained CNT film is limited not by the method used for CNT synthesis, but by the method used for coating. Thus, a large-area CNT film with a various thickness can be formed by selecting and using any of the above-described coating methods, if appropriate.

Among those methods, the spin coating method and the dip coating method are preferred as the coating method.

The drying to remove the solvent after the formation of a CNT film is not limited to a specific method. Moreover, the drying may be omitted depending on intended use.

For example, in a case in which toluene is used as the solvent, the solvent may be dried statically at room temperature. In a case in which water or a solvent with a high boiling point is used as the solvent, the solvent may be dried by heating, as appropriate.

Additionally, in a case in which a solvent with a low surface tension is used as the solvent, the shape of CNT assemblies can be controlled by controlling the temperature, the vapor pressure, and the like. Examples of the solvent with a low surface tension include supercritical fluids, such as supercritical carbon dioxide.

The removal of the dispersing agent is not limited to a specific method. Moreover, the removal may be omitted depending on intended use.

For example, the CNT film 100 may contain a flavin with an organic side chain. As evident from the fact that dispersing agents are used to prevent CNTs from aggregating with each other, the dispersing agents generally have the property of adhering to the surface of CNTs.

Thus, the dispersing agent can be removed within a shorter time period by washing with a smaller volume of a solvent that is different from the solvent used for the dispersion, as compared to washing with the same solvent as used for the dispersion.

For example, in a case in which a flavin with an organic side chain is used as the dispersing agent, chloroform may be used as a cleaning agent for washing.

Examples of the cleaning agent include water, an acidic or basic solution in water, chloroform, methylene chloride, N,N-dimethylformamide, and tetrahydrofuran, acetone.

Additionally, in a case in which sodium cholate, sodium deoxycholate, sodium dodecylbenzenesulfonate, or the like is used as the dispersing agent, water or ethanol is preferably used for washing.

Moreover, examples of a method for removing the dispersing agent include, in addition to a method using a cleaning agent, a method in which the washing is performed with a supercritical fluid, such as supercritical carbon dioxide, a method in which a dispersing agent is heated in oxygen to burn, melt, evaporate, or sublime the dispersing agent, and a method in which a dispersing agent is electrochemically oxidized or reduced into a readily removable chemical structure and then removed.

[Removal of CNT Film]

Finally, the CNT film 100 is removed from the substrate 110 where the CNT film 100 has been formed.

The substrate 110 where the CNT film 100 has been formed is immersed and shaken in a solvent to remove the CNT film 100 from the substrate 110. As the solvent, a cleaning agent, such as an acidic or basic solution in water or an organic solvent, may be used.

In a case in which an acidic polymer is used for the dispersion, an aqueous basic solution is suitable for use as a cleaning agent. Examples of the aqueous basic solution include an aqueous sodium hydroxide solution, an aqueous tetramethylammonium hydroxide solution, an aqueous potassium hydroxide solution, an aqueous cesium hydroxide solution, an aqueous tetraethylammonium hydroxide solution, an aqueous trimethyl-2-hydroxyethylammonium hydroxide (also referred to as "choline hydroxide") solution.

Accordingly, the production of the CNT film 100 is achieved.

EXAMPLES

The present disclosure will be described below in more detail by way of examples and the like. However, the disclosed invention is not limited to these examples.

In these examples, the above-described methods were performed to determine the 3σ and average values of reflectance and to convert a value of reflectance to a value of film thickness (optical thickness) and to measure the film thickness and the EUV light transmittance.

Example 1

[Preparation Step]

Single-wall CNTs (raw CNTs, manufactured by MEIJO NANO CARBON Co., Ltd.; product name: EC1.5-P, tube diameter: 1 nm to 3 nm, average tube diameter: 1.7 nm, tube length: 100 nm or more) synthesized by the enhanced direct injection pyrolytic synthesis method (the eDIPS method) were provided as raw CNTs including aggregates.

[Raw CNT Dispersion Production Step]

To 30 mg of single-wall CNTs synthesized by the enhanced direct injection pyrolytic synthesis method (the eDIPS method), 70 mL of isopropanol and 30 mL of ethanol were added, and 30 mg of polyacrylic acid was further added as an additive, and the resulting mixture was stirred at 40° C. for 18 hours with a magnetic stirrer at 1000 rpm (revolutions per minute) to obtain a suspension.

Ultrasonic dispersion was applied to the obtained suspension by using a probe-type ultrasonic homogenizer at 40% of the maximum power for a total of 2 hours, during which the suspension was cooled on ice every 20 minutes for a period of 5 minutes.

After the ultrasonic dispersion, the suspension was defoamed to obtain a dispersion containing raw CNTs (a raw CNT dispersion).

[Refined CNT Production Step]

The obtained raw CNT dispersion was centrifuged at 10° C. using a high-speed centrifuge (product name: himac CS100GX) at an average relative centrifugal force of 150,000×g for 120 minutes.

After the centrifugation, the supernatant was removed to obtain a dispersion containing refined CNTs (a refined CNT dispersion), in which aggregates or lumps of CNTs were removed.

[CNT Film Production Step]

A silicon substrate of 8 inches in size (roughness Ra: 0.15 nm) was spin-coated with the refined CNT dispersion at 1500 rpm to yield a CNT film on the silicon substrate.

The film was washed with water to remove the polyacrylic acid in the film and dried, and the silicon substrate was then immersed in water. Next, the CNT film was removed from the silicon substrate by keeping only the CNT film kept in the water and taking only the silicon substrate out of the water. Thus, the production of a CNT film with a mesh structure was completed, while the CNT film was floated on the surface of the water.

[Deposition]

The CNT film floated on the surface of the water was picked up with a silicon substrate of 8 inches in size to deposit the CNT film (pellicle film) on the silicon substrate.

Comparative Example 1

A CNT film with a mesh structure (pellicle film) was deposited on a silicon substrate in the same manner as in Example 1, except that the refined CNT production step was omitted and that the CNT film production step and the deposition were performed using the raw CNT dispersion obtained in the raw CNT dispersion production step.

Example 2

[Raw CNT Dispersion Production Step]

To 30 mg of single-wall CNTs (raw CNTs, manufactured by MEIJO NANO CARBON Co., Ltd.; product name: EC1.5-P, tube diameter: 1 nm to 3 nm, average tube diameter: 1.7 nm, tube length: 100 nm or more) synthesized by the enhanced direct injection pyrolytic synthesis method (the eDIPS method), 70 mL of isopropanol and 30 mL of ethanol were added, and 30 mg of polyacrylic acid was further added as an additive, and the resulting mixture was stirred at 40° C. for 18 hours with a magnetic stirrer at 1000 rpm (revolutions per minute) to obtain a suspension.

The obtained suspension was stirred at 25° C. using a homogenizer (manufactured by SMT Co., Ltd.; type: HF93) at 10000 rpm for 1 hour to obtain a dispersion containing raw CNTs (a raw CNT dispersion).

[Refined CNT Production Step]

The obtained raw CNT dispersion was centrifuged at 10° C. using a high-speed centrifuge at an average relative centrifugal force of 50,000×g for 60 minutes.

After the centrifugation, the supernatant was removed to obtain a dispersion containing refined CNTs (a refined CNT dispersion), in which aggregates or lumps of CNTs were removed.

In the CNT film production step, a silicon substrate of 8 inches in size was coated with the refined CNT dispersion by blade coating, in which the gap between the silicon substrate and the blade was set to 20 μm, to deposit a CNT film (pellicle film) with a mesh structure on the silicon substrate.

Example 3

The steps of producing a dispersion containing refined CNTs (a refined CNT dispersion) and of producing a CNT film were performed in the same manner as in Example 2 to deposit a CNT film (pellicle film) with a mesh structure on a silicon substrate, except that the gap between the silicon substrate and the blade was set to 10 μm.

The thickness and EUV light transmittance values of the CNT films (pellicle films) obtained in the above Examples and Comparative Example are shown in Table 2.

—Evaluation—

Average Reflectance and 3σ of Reflectance

In the reflectance measurement, the positions X=5 mm, 25 mm, 50 mm, 75 mm, and 95 mm were selected as measurement positions.

The average and 3σ values were determined for reflectance at measurement spots in each of the measurement positions. The measurement spots had a diameter of 20 μm.

The results are shown in Table 2.

—Average Film Thickness and 3σ of Film Thickness—

The average and 3σ values were determined for film thickness at each of the measurement positions X=5 mm, 25 mm, 50 mm, 75 mm, and 95 mm by the above methods. Additionally, the average film thickness values at the measurement positions were averaged to determine the thickness of the film. The results are shown in Table 2.

—Measurement of EUV Transmittance—

Each CNT film (pellicle film) was irradiated with light (EUV) at a wavelength of 13.5 nm by an EUV irradiation system (NewSUBARU facility BL-10, University of Hyogo) to measure the EUV transmittance. The beam size determined from the full width at half the maximum intensity of the incident light was 1.0 mm×0.06 mm.

—Reflective Microscopy—

The surface of each CNT film on a silicon substrate was observed with a light microscope.

Figure 18:
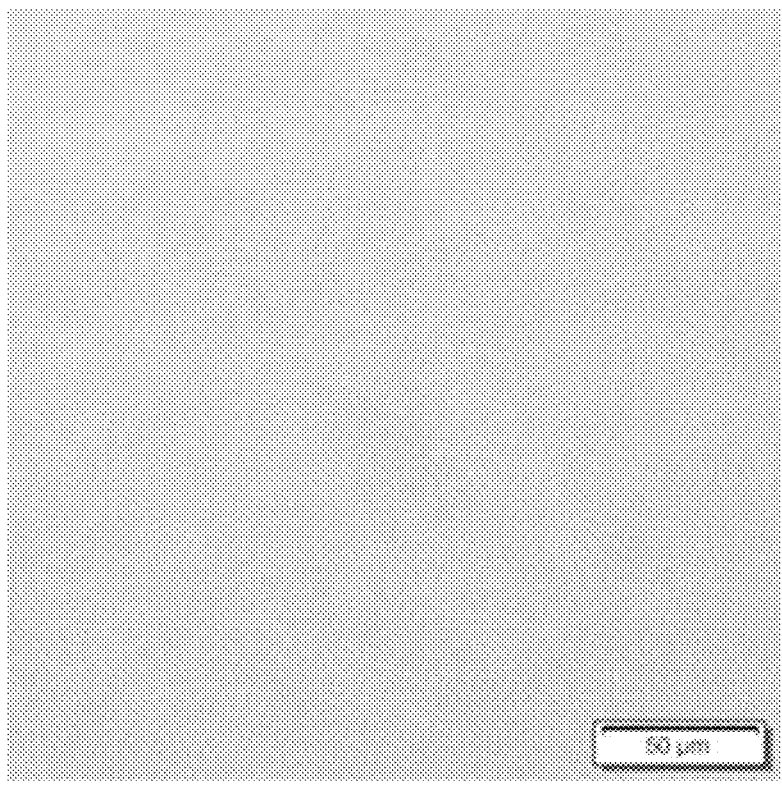
FIG. 18 shows a picture of the surface of a CNT film according to Example 1.

FIG. 18 shows a picture of the surface of a CNT film according to Example 1. In FIG. 18, a distribution of pale gray areas was observed, but few lumps or aggregates were observed, and no heterogeneous areas were visually observed.

Figure 19:
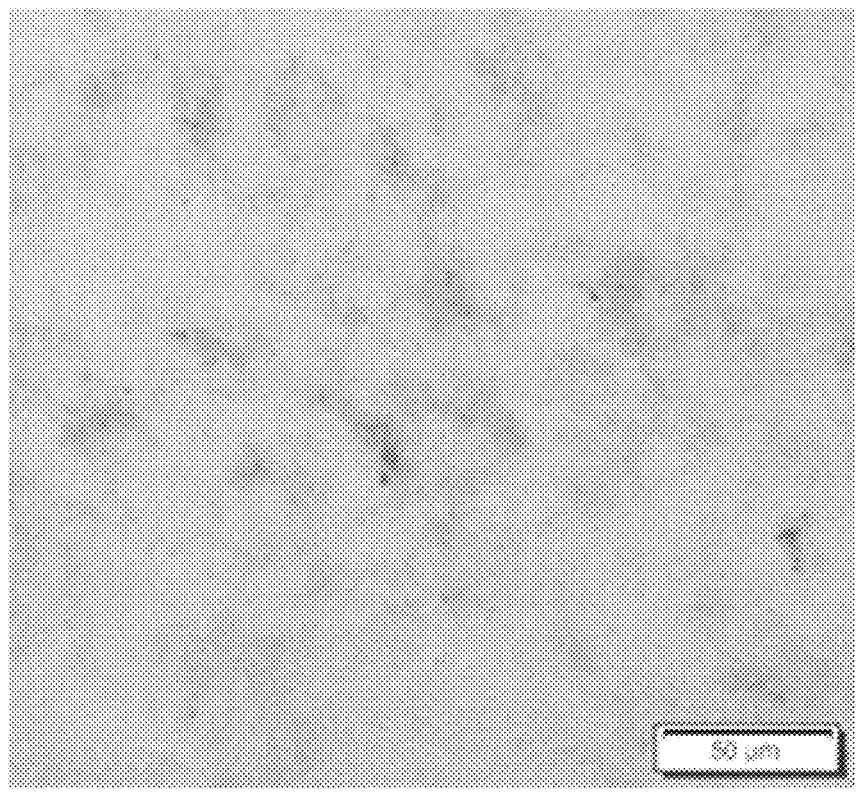
FIG. 19 shows a picture of the surface of a CNT film according to Comparative Example 1.

FIG. 19 shows a picture of the surface of a CNT film according to Comparative Example 1. In FIG. 19, lumps or aggregates were observed, and heterogeneity was visually observed for film thickness.

The effective length of CNTs was evaluated by the above method. A tube diameter of 1.7 nm was considered in the evaluation.

TABLE 2

| | Example 1 | | | | Comparative Example 1 | | | |
| --- | --- | --- | --- | --- | --- | --- | --- | --- |
| Positions | Average reflectance (%) | 3σ of reflectance (%) | Average of film thickness (nm) | 3σ of film thickness (nm) | Average reflectance (%) | 3σ of reflectance (%) | Average of film thickness (nm) | 3σ of film thickness (nm) |
| X = 5 | 35.3 | 2.2 | 22.0 | 0.84 | 45.1 | 22.6 | 16.6 | 9.7 |
| X = 25 | 36.3 | 5.0 | 21.6 | 1.97 | 44.3 | 27.0 | 16.9 | 11.6 |
| X = 50 | 34.4 | 6.6 | 22.5 | 2.70 | 46.1 | 33.4 | 16.1 | 14.5 |
| X = 75 | 34.5 | 7.7 | 22.6 | 3.26 | 51.5 | 37.5 | 14.0 | 17.8 |
| X = 95 | 38.8 | 7.6 | 20.7 | 3.14 | 63.1 | 42.4 | 10.7 | 19.9 |
| Difference in average reflectance between the maximum and the minimum values | 4.4 | — | — | — | 18.8 | — | — | — |
| Thickness (nm) | | 21.9 | | | | 14.9 | | |
| Effective CNT length (μm) | | 0.90 | | | | 0.90 | | |

TABLE 2-continued

| | | |
|---|---|---|
| Breaking load (μN/nm) | 3.1 | — |
| EUV light transmittance (%) | 92.4 | 93.8 |

| Positions | Example 2 Average re-flectance (%) | 3σ of re-flectance (%) | Average of film thick-ness (nm) | 3σ of film re-flectance (nm) | Example 3 Average re-flectance (%) | 3σ of re-flectance (%) | Average of film thick-ness (nm) | 3σ of film thick-ness (nm) |
|---|---|---|---|---|---|---|---|---|
| X = 5 | 58.6 | 1.4 | 12.3 | 0.78 | 65.8 | 1.5 | 7.1 | 1.65 |
| X = 25 | 59.7 | 1.4 | 11.6 | 0.81 | 66.2 | 1.2 | 6.8 | 0.99 |
| X = 50 | 50.1 | 7.3 | 15.5 | 3.82 | 66.3 | 1.1 | 6.8 | 0.87 |
| X = 75 | 59.2 | 2.7 | 12.0 | 1.50 | 66.2 | 1.5 | 6.9 | 1.22 |
| X = 95 | 61.2 | 1.3 | 10.4 | 0.75 | 65.9 | 1.4 | 7.1 | 1.14 |
| Difference in average reflectance between the maximum and the minimum values | 11.1 | — | — | — | 0.5 | — | — | — |
| Thickness (nm) | | | 12.4 | | | | 6.9 | |
| Effective CNT length (μm) | | | 2.5 | | | | 2.5 | |
| Breaking load (μN/nm) | | | 5.1 | | | | — | |
| EUV light transmittance (%) | | | 95.9 | | | | 97.7 | |

Each of the carbon nanotube films, which was a carbon nanotube film containing carbon nanotubes, transmitted 80% or more of EUV light at a wavelength of 13.5 nm, had a thickness from 1 nm to 50 nm, and was deposited on a silicon substrate. The pellicle films for photolithography according to Examples, in which the 3σ of the reflectance was 10% or less when the reflectance of the deposited carbon nanotube film was measured using a reflectance spectrophotometer-based film thickness meter under the above-described conditions, gave a small value for the 3σ of the film thickness, which means high thickness uniformity.

The pellicle film for photolithography according to Comparative Example 1, in which the 3σ of the reflectance was more than 10%, gave a large value for the 3σ of the film thickness, which means low thickness uniformity.

In the pellicle film of Example 1, the 3σ of the reflectance was 10% or less at all the measurement positions, and the difference between the maximum and the minimum values of average reflectance was 15% or more.

In the pellicle film of Example 1, when the CNT film deposited on the silicon substrate was observed under a light microscope, a distribution of pale gray areas were observed, but few lumps or aggregates were observed, and no heterogeneous areas were visually observed as an indication of heterogeneity in film thickness.

In the pellicle film of Example 1, the average film thickness value was small, and the 3σ of the film thickness was also small. Thus, the pellicle film of Example 1 was indicated to have less variation in film thickness both over local and wide areas. That is, the pellicle film of Example 1 was indicated to have high uniformity in thickness.

Additionally, the pellicle film of Example 1 has a high EUV transmittance over the entire surface and is thus suitable as an EUV pellicle film.

In the pellicle film of Comparative Example 1, the 3σ of the reflectance was positions 10% or more at all the measurement, and the difference between the maximum and the minimum values of average reflectance was 10% or more.

In the pellicle film of Comparative Example 1, when the CNT film deposited on the silicon substrate was observed under a light microscope, a distribution of clear gray areas was observed over the entire surface, and lumps or aggregates were observed over the entire surface, and heterogeneous areas were visually observed.

The pellicle film of Comparative Example 1 had variations in film thickness over local areas and had low thickness uniformity.

In the pellicle film of Example 2, the 3σ of the reflectance was 10% or less at all the measurement positions.

The pellicle film of Example 2 had less variation in film thickness over local areas.

The pellicle film of Example 2 was indicated to have less variation in film thickness over wider areas, though the degree of variation was not as less as that in Example 1.

In the pellicle film of Example 3, the 3σ of the reflectance was 10% or less at all the measurement positions.

Additionally, the difference between the maximum and the minimum values of average reflectance was 5% or less.

The pellicle film of Example 3 had much less variation in film thickness over local areas.

The pellicle film of Example 3 was indicated to have much less variation in film thickness over wider areas.

The disclosure of the Japanese Patent Application No. 2020-074343, filed on Apr. 17, 2020, is incorporated herein by reference in its entirety.

All publications, patent applications, and technical standards described herein are herein incorporated by reference as if each individual publication, patent application, or technical standard was specifically and individually indicated to be incorporated by reference.

The invention claimed is:

1. A pellicle film for photolithography, comprising a carbon nanotube film, wherein:
   the carbon nanotube film contains carbon nanotubes;
   the carbon nanotube film transmits 80% or more of EUV light at a wavelength of 13.5 nm;
   the carbon nanotube film has a thickness from 1 nm to 50 nm;
   wherein a 3σ of a reflectance is 15% or less in a case in which the carbon nanotube film is disposed on a silicon substrate, and a reflectance of the disposed carbon nanotube film is measured using a reflectance spectrophotometer-based film thickness meter under the following conditions:
   a diameter of measurement spots of 20 μm;
   a reference measurement wavelength of 285 nm;
   a number of measurement spots of 121 spots; and
   a distance between centers of adjacent measurement spots of 40 μm.

2. The pellicle film for photolithography according to claim 1, wherein a value obtained by subtracting a minimum average reflectance from a maximum average reflectance is calculated to be 15% or less in a case in which the carbon nanotube film is disposed on a silicon substrate, and the reflectance of the disposed carbon nanotube film is measured at multiple measurement positions spaced 2 cm or more apart from each other by using a reflectance spectrophotometer-based film thickness meter under the following conditions to calculate the average reflectance:
   the diameter of measurement spots of 20 μm;
   the reference measurement wavelength of 285 nm;
   the number of measurement spots of 121 spots; and
   the distance between the centers of adjacent measurement spots of 40 μm.

3. The pellicle film for photolithography according to claim 1, wherein the carbon nanotubes have a tube diameter from 0.8 nm to 6.0 nm.

4. The pellicle film for photolithography according to claim 1, further comprising a protective layer disposed in contact with the carbon nanotube film.

5. The pellicle film for photolithography according to claim 1, wherein the carbon nanotubes have an effective length of 0.1 μm or more.

6. The pellicle film for photolithography according to claim 1, wherein a breaking load determined by a nanoindentation test is 1.0 μN/nm or more.

7. A pellicle, comprising:
   a pellicle film for photolithography according to claim 1, and
   a supporting frame for supporting the pellicle film for photolithography.

8. A photolithography mask, comprising a photomask and the pellicle according to claim 7 disposed on a patterned surface of the photomask.

9. A photolithography system, comprising the photolithography mask according to claim 8.

10. A photolithography system, comprising a light source that emits illumination light, the photolithography mask according to claim 8, and an optical system that guides the illumination light emitted from the light source to the photolithography mask, wherein:
    the photolithography mask is disposed such that the illumination light emitted from the light source passes through the pellicle film for photolithography and illuminates the photolithography mask.

11. The photolithography system according to claim 10, wherein the illumination light is EUV light.

12. A method of producing the pellicle film for photolithography according to claim 1, the method comprising the steps of:
    preparing raw carbon nanotubes including aggregates;
    mixing the raw carbon nanotubes with a solvent to produce a dispersion;
    removing the aggregates contained in the dispersion to obtain refined carbon nanotubes; and
    forming a sheet from the refined carbon nanotubes to produce a carbon nanotube film.

13. The method of producing a pellicle film for photolithography according to claim 12, wherein ultracentrifugation is performed at an average relative centrifugal force of 5,000×g or more for 60 minutes or more in the step of obtaining refined carbon nanotubes.

14. The pellicle film for photolithography according to claim 1,
    wherein the carbon nanotubes are refined carbon nanotubes in which ultracentrifugation is performed at an average relative centrifugal force of 5,000×g or more for 60 minutes or more,
    wherein a 3σ of a film thickness obtained from a standard deviation values of a film thickness is 3.82 nm or less in a case in which the reflectance of the disposed carbon nanotube film is measured under the conditions of claim 1, and reflectance spectra in a wavelength range from 200 nm to 600 nm with a wavelength increment of 1.3 nm to 1.5 nm are obtained for each of the measurement spots to calculate the film thickness at each of the measurement spots, and
    wherein a breaking load determined by nanoindentation test is 3.1 μN/nm or more.

* * * * *